US006438667B1

United States Patent
Shinozaki

(12) United States Patent
(10) Patent No.: US 6,438,667 B1
(45) Date of Patent: Aug. 20, 2002

(54) SEMICONDUCTOR MEMORY AND MEMORY SYSTEM

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/236,338

(22) Filed: Jan. 25, 1999

(30) Foreign Application Priority Data

Sep. 8, 1998 (JP) .......................................... 10-253406

(51) Int. Cl.[7] .......................... G06F 12/14; G01R 31/28
(52) U.S. Cl. ...................... 711/163; 711/149; 711/158; 711/169; 714/712
(58) Field of Search .......................... 712/224; 711/163, 711/131, 149, 154, 158, 169; 710/104; 713/323; 365/222; 714/763

(56) References Cited

U.S. PATENT DOCUMENTS 5,706,468 A * 1/1998 Hatanaka ..................... 711/149
5,778,237 A * 7/1998 Yamamoto et al. ......... 713/323
5,848,247 A * 12/1998 Matsui et al. ............... 710/104
5,898,700 A * 4/1999 Kim ............................ 714/712
5,901,101 A * 5/1999 Suzuki et al. ............... 365/222
6,182,262 B1 * 1/2001 Seyyedy ..................... 714/763

OTHER PUBLICATIONS

Raposa, "Dual Port Static Ram Testing", (c) 1988 IEEE, p. 362–368.*
Alves et al., "Testing Embedded Single and Multi-port RAMs using bist and Boundary Scan", (c) 1992 IEEE, p. 159–163.*

* cited by examiner

Primary Examiner—Matthew Kim
Assistant Examiner—Brian R. Peugh
(74) Attorney, Agent, or Firm—Arent Fox Kintner Plotkin & Kahn, PLLC

(57) ABSTRACT

When a test instruction signal is outputted from a command decoder, a test mode decoder receives the test instruction signal and outputs a test signal. When a DQM switch circuit receives the test signal, the DQM switch circuit outputs a mask/disable signal (MASK0 or MASK1) inputted to any one of two mask/disable terminals (DQML, DQMU) as a mask/disable signal inputted from the two terminals DQML and DQMU to a write amplifier/sense buffer. Therefore, it is possible to execute a mask/disable operation for all of input and output data with one of the two mask/disable terminals.

8 Claims, 26 Drawing Sheets

FIG.5

| TEST SIGNAL | SW0 | SW1 |
|---|---|---|
| L | ON | OFF |
| H | OFF | ON |

FIG.10

| TEST SIGNAL | SW10 | SW11 | SW12 | SW13 |
|---|---|---|---|---|
| L | ON | ON | OFF | OFF |
| H | OFF | OFF | ON | ON |

SEMICONDUCTOR MEMORY AND MEMORY SYSTEM

FIELD OF THE INVENTION

The present invention relates to a semiconductor memory having a plurality of data input/output terminals, and more specifically to a semiconductor memory having a plurality of mask/disable terminals and executing a mask/disable operation for inhibiting data write/read to and from a corresponding data input/output terminal according to each mask/disable control signal.

BACKGROUND OF THE INVENTION

A semiconductor memory as represented by a RAM (Random Access Memory) or a ROM (Read Only Memory) has a plurality of data input/output terminals corresponding to a plurality of bits to enable storage of a large capacity of data and high speed operations for writing or reading data. Of the memories as described above, there are ones each having a mask/disable terminal for inhibiting operations for writing or reading data.

In recent years, various types of semiconductor memory module having a plurality of packaged semiconductor memories (described as semiconductor memory device hereinafter) for realization of a larger storage capacity have been introduced into the market. In this type of semiconductor memory module, a common data bus is shared by a plurality of semiconductor memory devices, and in that case, permission of operations for writing or reading data should be made for each semiconductor memory, and data input/output with high flexibility has been enabled by using the semiconductor memory having a plurality of mask/disable terminals as the semiconductor memory device.

A semiconductor memory comprising a synchronous dynamic RAM having mask/disable terminals and operating in synchronism to an external clock (described as SDRAM hereinafter) as one example of the conventional technology will be described. FIG. 16 is a block diagram showing general configuration of a semiconductor memory based on the conventional technology. FIG. 16 especially shows a SDRAM based on the memory bank system enabling management of a memory capacity larger than the address space of a MPU by utilizing a MPU (Micro Processing Unit).

In FIG. 16, SDRAM 100 comprises memory arrays each in turn comprising memory cells as memory units in a matrix form, and the memory arrays are divided into two banks (bank 0, bank 1) with each bank further divided into a plurality of blocks. Each bank has a row decoder 102 and a column decoder 103, and one memory cell is selected from a memory array 101 by the decoders 102, 103. The row decoder 102 is a circuit that receives a row address signal 110 and selects one word line from those each identifying a memory cell in the row direction. The column decoder 103 is a circuit that receives a column address signal 111 and selects one bit line from those each identifying a memory. cell in the column direction. A sense amplifier 104 for amplifying an electric charge stored in a memory cell is connected to each bit line.

Data in a memory cell identified by the row decoder 102 and column decoder 103 according to a data read command in the bank 0 or bank 1 is inputted via a global database (GDB) into a write amplifier/sense buffer 105. In this SDRAM 100, input/output of data comprising a plurality of bits is capable, and for instance when input/output of 16-bit data is to be executed, 2-byte data for a memory cell identified according to inputted row address signal 110 as well as according to inputted column address signal 111 is latched in the write amplifier/sense buffer 105 for parallel output of data.

The read data latched in the write amplifier/sense buffer 105 is transferred to an I/O data buffer/register 107 and it is outputted from data input/output terminals DQ0 to DQn of the I/O data buffer/register 107.

When a data write command is received, write data is sent from the write amplifier/sense buffer 105 via the GDB 106 to a memory cell identified by the row decoder 102 and column decoder 103. The write data is inputted from data input/output terminal DQ0 to DQn of the I/O data buffer/register 107 and transferred to the write amplifier/sense buffer 105.

The row address signal 110 and column address signal 111 are generated according to signals inputted from address terminals A0 to An of an address buffer/register & bank select 108.

A RAS signal 120, a CAS signal 121 and a WE signal 122 are inputted into the bank 0 or bank 1, and a control instruction such as a write instruction or a read instruction is decided according to a combination of these three signals. Especially, functions of the write amplifier/sense buffer 105 are decided according to the control instruction.

The RAS signal 120, CAS signal 121 and WE signal 122 inputted into the bank 0 or bank 1 are outputted from a control signal latch 113. The control signal latch 113 receives a command signal 125 from a command decoder 112, latches a control signal indicated by the command signal 125, and outputs the RAS signal 120, CAS signal 121 and WE signal 122 each as a signal level capable of expressing a control instruction according to a combination of the signals.

A command decoder 112 receives a /CS signal, a /RAS signal, a /CAS signal and a /WE signal, decides a control instruction according to a combination of these signals, and outputs a command instruction indicating the control instruction. The command decoder 112 also decides an access mode according a combination of the /CS signal, /RAS signal, /CAS signal and /WE signal, and outputs a mode signal 126 indicating the access mode.

The mode register 114 receives the mode signal 126 and address signals A0 to An transferred via the address buffer/register & bank selector 108 and temporally stores therein the signals. The column address counter 109 determines an access mode such as a burst read mode according to the mode signal and address signal stored in the mode register 114, and generates and outputs the column address signal 111 corresponding to the determined access mode.

The SDRAM 100 operates according to a synchronous signal (CLK) given from the outside such as a system clock from the MPU, and can executes operations in the internal circuit described above at a high speed. A clock buffer 115 receives a clock signal (CLK) given from the outside and a clock enable signal (CKE) controlling output of the clock signal, and supplies the received clock signal to each of the circuits described above. The clock buffer 115 also provides the received clock enable signal to each of the command decoder 112, address buffer/register & bank select 108 and I/O data buffer/register 107.

The I/O data buffer/register 107 receives a mask/disable signal from the mask/disable terminal described above. Specifically the I/O data buffer/register 107 receives a DQMU signal which is a signal for masking/disabling upper bits of the data signals DQ0 to DQn from the DQMU terminals, and also receives a DQML signal which is a signal for masking/disabling lower bits of the data signals DQ0 to DQn from the DQML terminal.

The DQMU signal and DQML signal are sent as MASK0 and MASK1 signals to the bank 0 and bank 1 respectively, and are inputted into the write amplifier/sense buffer 105 in each bank. When the DQMU signal (MASK1) indicates a "H" level and a control instruction given to the bank 0 and bank 1 is a write instruction, the write amplifier/sense buffer 105 masks data corresponding to upper bits of the data signals DQ0 to DQn, namely an operation for writing the data into the write amplifier/sense buffer 105 is inhibited. When the DQML signal (MASK0) indicates the "H" level and a control instruction given to the bank 0 and bank 1 is a write instruction, the write amplifier/sense buffer 105 masks data corresponding to lower bits of the data signals DQ0 to DQn, namely an operation for writing the data into the write amplifier/sense buffer 105 is inhibited.

When the DQMU signal indicates a "H" level and a control instruction given to the bank 0 and bank 1 is a read instruction, the write amplifier/sense buffer 105 masks data corresponding to lower bits of the data signals DQ0 to DQn, namely an operation for reading the data from the write amplifier/sense buffer 105 is inhibited. When the DQML signal indicates a "H" level and a control instruction given to the bank 0 and bank 1 is a read instruction, the write amplifier/sense buffer 105 masks data corresponding to lower bits of the data signals DQ0 to DQn, namely an operation for reading data from the write amplifier/sense buffer 105 is inhibited.

FIG. 17 is an explanatory view showing key sections of a semiconductor memory according to the conventional technology, and shows configuration of a data input/output section of the SDRAM according to the conventional technology. The I/O data buffer/register 107 shown in FIG. 16 is actually divided, as shown in FIG. 17, into an I/O data buffer 131 connected to the data input/output terminals for data signals DQ0 to DQ15 and DQM input buffers 132 and 133 connected to mask terminals for the DQML and DQMU signals respectively.

The write amplifier/sense buffer 105 shown in FIG. 16 is actually divided, as shown in FIG. 17, into write amplifier/sense buffers 141 corresponding to the data input/output terminals for the data signals DQ0 to DQ15. Further, the DQM input buffer 132 is connected to eight units of write amplifier/sense buffers 141 corresponding to the data signals DQ0 to DQ7, while the DQM input buffer 133 is connected to 8 units of write amplifier/sense buffers 141 corresponding to the data signals DQ8 to DQ15.

Because of this configuration, when a data write instruction is given to a bank, more specifically to the write amplifier/sense buffers 141, each of data inputted into the data input/output terminals DQ0 to DQ15 is inputted via the I/O data buffer 131 into the write amplifier/sense buffers 141 and then is sent to the GDB 106.

In this step, when a mask/disable signal inputted from the DQML terminal indicates a "H" level, namely inhibition of an operation for writing data, data transfer from the write amplifier/sense buffers 141 corresponding to the data input/output terminals DQ0 to DQ7 to the GDB 106 is not executed. Similarly, when a mask/disable signal inputted from the DQMU terminal indicates a "H" level, data transfer from the write amplifier/sense buffers 141 corresponding to the data input terminals DQ8 to DQ15 is not executed.

When a data read instruction is given to a bank, more specifically to the write amplifier/sense buffer 141, data in memory cells successively identified according to the row address signal 110 and column address signal 111 is sent to the GDB 106 and inputted to the write amplifier/sense buffer 141 connected to each GDB 106. Data inputted to each write amplifier/sense buffer 141 is sent to each corresponding I/O data buffer 131 and is outputted from the data input/output terminals DQ0 to DQ15.

In this step, when a mask/disable signal inputted from the DQML terminal indicates a "H" level, namely inhibition of an operation for reading data, data transfer from the write amplifier/sense buffers 141 corresponding to the data input/output terminals DQ0 to DQ7 to the I/O data buffer 131 is not executed. When a mask/disable signal inputted from the DQMU terminal indicates a "H" level, data transfer from the write amplifier/sense buffers 141 corresponding to the data input/output terminals DQ8 to DQ15 to the I/O data buffer 131 is not executed.

Next, detailed description is made for the write amplifier/sense buffers 141. FIG. 18 is a view showing connection among the write amplifier/sense buffers 141, I/O data buffer 131, and DQM input buffer 132. FIG. 18 especially shows configuration relating to the data input/output terminal DQ0, but any of the other data input/output terminal DQ1 to DQ15 has the same configuration. As shown in FIG. 18, the write amplifier/sense buffer 141 is actually divided into a sense buffer 151 and a write amplifier 152. In the write amplifier/sense buffer 141, the sense buffer 151 operates in response to a data read instruction, receives read data (Rdata 0/1) sent to the GDBs (GDB0, GDB1) and sends the received read data to the I/O data buffer 131. The sense buffer 151 also received a mask/disable signal (MASK0) outputted from the DQM input buffer 132, and executes an operation for disabling data read in response to a signal level of the MASK0 signal.

On the other hand, in the write amplifier/sense buffer 141, the write amplifier 152 operates in response to a data write instruction, receives write data (Wdata) outputted from the I/O data buffer 131, and sends the received write data to the GDBs (GDB0, GDB1). The write amplifier 152 receives the mask/disable signal (MASK0) outputted from the DQM input buffer 132, and executes an operation for masking against data write in response to a signal level of the MASK0 signal.

In a DRAM such as a SDRAM, generally a signal level of one data is determined by comparing signal levels of complimentary data signals each other, so that a signal level of data sent to the GDB 106 is decided by the two signals GDB0 and GDB1, and herein description is made assuming that a signal level of GDB0 against a level of a signal sent to the GDB1 is a signal level of data inputted to or outputted from the I/O data buffer 131.

Next, detailed description is made for the sense buffer 151. FIG. 19 is an explanatory view showing circuit configuration of the sense buffer 151. In FIG. 19, the sense buffer 151 comprises two transfer gates SW100 and SW101, three switching elements (herein, FET elements) TR100, TR101 and TR102, three inverters 161, 163 and 166, and three NAND gates 162, 164 and 165.

The sense amplifier 104 is connected to the GDB0 and GDB1 in turn connected to the sense buffer 151 respectively, and data is sent from this sense amplifier to the GDB0 and GDB1.

The read data Rdata0 signal and Rdata1 signal each outputted from the sense buffer 151 indicates the same signal level respectively, and the signals are inputted into the I/O data buffer data 131. In the sense buffer 151, the Rdata0 signal is outputted from a NAND gate 164, while the Rdata1 signal is outputted from an inverter 166. The inverter 166 has the input terminal connected to an output terminal of the NAND gate 165. Further, one input terminal of the NAND gate 164 is connected to an output terminal of the NAND gate 165, while an input terminal of the NAND gate 165 is connected to an output terminal of the NAND gate 164. Because of this configuration, a signal level of Rdata0/1 depends on a signal level of signals inputted to the other input terminal of the NAND gate 164 and the other input terminal of the NAND gate 165 respectively.

The other input terminal of the NAND gate 164 is connected to one of contact terminals of the transfer gate SW100 as well as to a D terminal of the switching element TR100. The other input terminal of the NAND gate 165 is connected to the other contact terminal of the transfer gate SW101 as well as to a D terminal of the switching element TR101. The other contact terminals of the transfer gate SW100 and SW101 are connected to a power terminal indicating a "H" level respectively, so that a level of a signal inputted to the other input terminal of the NAND gate 164 and that of the NAND gate 165 is decided by ON/OFF state of the transfer gates SW100, SW101 and switching elements TR100 and TR101. Namely, a signal level of the Rdata0 signal and Rdata1 signal (Rdata0/1) is decided according to ON/OFF state of the transfer gates SW100, SW101 and switching elements TR100, TR101.

The output terminals of both of the transfer gates SW100 and SW101 are connected to an output terminal of the inverter 163. An output terminal of the NAND gate 162 and an input terminal of the inverter 163 are connected to each other. The NAND gate 162 receives a control signal (READ) indicating a data read instruction from one of the input terminals and receives an output signal from the inverter 161 from the other input terminal. The inverter 161 receives the MASK0 signal outputted from the DQM input buffer 132 and outputs the inverted signal. Because of this configuration, ON/OFF of the transfer gates SW100 and SW101 is controlled according to a level of a signal outputted from the NAND gate 162, namely according to the READ signal and MASK0 signal.

On the other hand, the switching element TR100 has the G terminal connected to the GDB0, while the switching element TR101 has the G terminal connected to the GDB1. Namely, ON/OFF of the switching elements TR100 and TR101 is controlled according to a signal level of the signals sent to the GDB0 and GDB1. Both of S terminals of the switching elements TR100 and TR101 are connected to a D terminal of the switching element TR102. The switching-element TR102 has the S terminal connected to a electric potential indicating a "L" level, and when the switching element TR100 is ON, namely when a signal with a signal level higher than a threshold level (herein, "H" level" for the switching element TR100 is inputted to the G terminal of the switching element TR100, and simultaneously when the switching element TR102 is ON, namely when a signal with a signal level higher than a threshold level (herein, "H" level) for the switching element TR102 is inputted to the G terminal of the switching element TR102, the D terminal of the switching element TR101 is set in a "L" level potential. In other words, a signal with the "L" signal level is inputted to the other input terminal of the NAND gate 164.

When the switching element TR101 is ON, namely when a signal with a signal level higher than a threshold level (herein, "H" level) for the switching element TR101 is inputted to the G terminal of the switching element TR101, and simultaneously when the switching element TR102 is one, namely when a signal with a signal level higher than a threshold level (herein, "H" level) for the switching element TR101 is inputted to the G terminal of the switching element TR102, the D terminal of the switching element TR101 is set in a "L" level potential. In other words, a signal with the "L" signal level is inputted to the other input terminal of the NAND gate 165.

An output terminal of the inverter 163 is connected to the G terminal of the switching element TR102, and ON/OFF state of the switching element TR102 is controlled according to the READ signal as well as to the MASK0 signal.

Namely, during an operation for reading out data, when the READ signal is set in a "H" level, the transistor TR102 is turned ON with a differential amplifier comprising the transistors TR100 and TR101 activated, and data for the GDB1 and GDB0 is outputted as Rdata0 and Rdata1 respectively. Even during the operation for reading out data, when the mask signal MASK0 is set in a "H" level, the transistor TR102 is turned OFF, and data for the GDB1 and GDB0 is not outputted from the differential amplifier.

FIG. 20 is a time chart for signals inputted into and outputted from the sense buffer 151 (signals sent to the GDB0 and GDB1, READ signal, MASK0 signal, Rdata0 signal and Rdata1 signal).

At first in a period of pulse generation for a first READ signal (period (1)), or to describe more precisely, in a first transition of a pulse for the first READ signal, when the MASK0 signal indicates a "L" level, namely when an operation for disabling data read is not executed, output from the NAND gate 162 indicates a "L" level with the inverter 163 indicating a "H" level if a signal on the GDB0 indicates a "H" level and simultaneously a signal on the GDB1 indicates a "L" level, and both the transfer gates SW100 and SW101 are turned ON. Further, the switching element TR100 is turned ON. Then a signal on the GDB0 indicates a "H" level with the switching element TR100 turned ON, and a signal with a "L" level is inputted to the other input terminal of the NAND gate 164. Namely the NAND gate 164 outputs a signal with a "H" level as the Rdata0 signal.

When a signal on the GDB1 indicates a "L" level, the switching element TR101 is turned OFF, and a signal with a "H" level supplied from the transfer gate SW101 is inputted to the other input terminal of the NAND gate 165. Herein, a signal with the "H" level outputted from the NAND gate 164 is inputted to the other input terminal of the NAND gate 165, so that the NAND gate 165 outputs a signal with a "L" level. A signal outputted from the NAND gate 165 is inverted by the inverter 166 and outputted as the Rdata1 signal, so that, in this case, also the Rdata1 signal indicates a "H" level like the Rdata0 signal.

Next, in a period of pulse generation for a second READ signal (period (2)), or to described more precisely, in a first transition of a pulse for the second READ signal, when the MASK0 signal indicates a "L" level and simultaneously the GDB0 signal indicates a "L" level, namely when a signal on the GDB1 indicates a "H" level, output from the NAND gate 162 ("L" level) and output from the inverter 163 ("H" level) do not change with both the transfer gates SW100 and SW101 turned ON, while the switching element TR102 is kept ON. A difference between the period (1) is that, when a signal on the GDB0 indicates a "L" level, the switching element TR100 is turned OFF, and a signal with a "H" level supplied from the transfer gate SW100 is inputted to the other input terminal of the NAND gate 164.

When a signal on the GDB1 indicates a "L" level, the switching element TR101 is turned ON, and a signal with a "L" level is inputted to the other input terminal of the NAND gate 165. Namely, the NAND gate 165 outputs a signal with a "H" level. A signal outputted from the NAND gate 165 is inverted by the inverter 166 and outputted as the Rdata1 signal, and in this case the Rdata1 signal indicates a "L" level. Herein one input terminal of the NAND gate 164 receives a signal with a "H" level outputted from the NAND gate 165, so that the NAND gate 164 outputs a signal with a "L" level as the Rdata0 signal.

When the MASK0 signal indicates a "L" level, namely when an operation of disabling data read is not executed, the Rdata0 signal and Rdata1 signal indicates the same signal level as that of the signal sent to the GDB0 and are sent to the I/O data buffer 131.

In a period of pulse generation for a third READ signal (period (3)), or to described more precisely, when the MASK0 signal indicates a "H" level, namely when an operation for disabling data read is executed, if a signal of the GDB0 indicates a "H" level and simultaneously a signal on the GDB1 indicates a "L" level, output from the NAND gate 162 indicates a "H" level and the inverter 163 indicates a "L" level, so that both the transfer gates SW100 and SW101 are turned OFF. Further, the switching element TR102 is turned OFF. When a signal on the GDB0 indicates a "H" level, the switching element TR100 is turned ON, but the switching element TR102 is in OFF state, in addition, a "H" level potential is not supplied from the transfer gate SW100, so that a level of a signal inputted to the other input terminal of the NAND gate 164 becomes unstable.

When a signal on the GDB1 indicates a "L" level, the switching element TR100 is turned OFF, but a potential with a "H" level is not supplied from the transfer gate SW101, so that a level of a signal inputted to the other input terminal of the NAND gate 165 becomes unstable.

Therefore, output from the NAND gates 164 and 165 does not change, and a level of the Rdata0 signal and Rdata1 signal is not changed. With this feature, an operation for disabling data read is achieved. In FIG. 20, a portion indicated by the dotted lines is a signal not outputted because of the disabling operation.

In a period of pulse generation for a fourth READ signal (period (4)), or to described more precisely, the MASK0 signal again indicates a "L" level, and the same state as that in the period (2) is effected.

Next, detailed description is made for the write amplifier 152. FIG. 21 is an explanatory view showing circuit configuration of the write amplifier 152. In FIG. 21, the write amplifier 152 comprises two transfer gates SW110 and SW111, five inverters 171, 173, 174, 175 and 176, and one NAND gate 172.

The GDB0 and GDB1 connected to the write amplifier 152 are further connected to the sense amplifier 104, and write data in the sense amplifier 104 according to a write signal sent to the GDB0 and GDB1.

Write data Wdata outputted from the I/O data buffer 131 is inputted to the inverter 174 as a write amplifier with the signal level inverted therein and then the signal is outputted. An output terminal of the inverter 174 is connected to one contact terminal of the transfer gate SW110 and also to an input terminal of the inverter 175. Herein the contact terminal of the transfer gate SW110 is connected to the GDB1, and when the transfer SW110 is ON, the Wdata signal with the signal level inverted is sent to the GDB1.

An output terminal of the inverter 175 is connected to one contact terminal of the transfer gate SW111. The other contact terminal of the transfer gate SW1 is connected to the GDB0, and when the transfer gate SW111 is ON, a signal with the same level as that of the Wdata signal is sent to the GDB0.

With the two inverters 174 and 175, it is possible to send two types of signals, namely two signals with mutually inverted levels to the GDB0 and GDB1 in response to one write data Wdata.

One control terminal of the transfer gate SW110 is connected to an output terminal of the inverter 173, and the other control terminal is connected to an output terminal of the inverter 176. An input terminal of the inverter 176 is also connected to an output terminal of the inverter 173, so that the ON/OFF of the transfer gate SW110 is controlled according to a level of a signal outputted from the inverter 173.

The other input control terminal of the transfer gate SW111 is connected to an output terminal of the inverter 173, and also the other output terminal is connected to an output terminal of the inverter 176. With this configuration, like in the transfer gate SW110, also the ON/OFF of the transfer gate SW111 is controlled according to a level of a signal outputted from the inverter 173.

An input terminal of the inverter 173 is connected to an output terminal of the NAND gate 172. The NAND gate 172 receives a control signal (WE) indicating a data write instruction from one input terminal thereof, and receives an output signal from the other input terminal. The inverter 171 receives the MASK0 signal outputted from the DQM buffer 132, and outputs the inverted signal. Because of this configuration, ON/OFF of the transfer gates SW110 and SW111 is controlled according to a level of a signal outputted from the NAND gate 172, namely to the READ signal and MASK0 signal.

Therefore, the level of signals on the GDB0 and GDB1 changes according to the Wdata signal, WE signal and MASK0 signal. Namely, when the WE signal is set in a "H" level in data write, the transfer gates SW110 and SW111 are turned ON, and write data outputted from the write amplifier 174 is sent to the GDB1 and GDB0. On the other hand, when the MASK0 signal is at a "L" level in this step, the transfer gates SW110 and SW111 are turned OFF, and transmission of data write from the write amplifier 174 to the GDB1 and GDB0 is inhibited.

FIG. 22 is a time chart for signals inputted to or outputted from the write amplifier 152 (Wdata signal, WE signal, MASK0 signal, and signals sent to the GDB0 and GDB1).

At first, in a period of pulse generation for a first WE signal (period (1)), or to describe more precisely in a first transition of a pulse for the first WE signal, when the MASK0 signal indicates a "L" level, namely when a masking operation against data write is not executed, if the Wdata signal indicates a "L" level, output from the NAND gate 172 indicates the "L" level, while the inverter 173 indicates a "H" level, and both the transfer gates SW110 and SW111 are turned ON.

As the Wdata signal indicates a "L" level, a "H" level signal obtained by inverting the signal by the inverter 174 is sent via the transfer gate SW110 to the GDB1. In addition, a signal indicating a "H" level outputted from the inverter 174 is inputted to and inverted by the inverter 175, and is sent as a signal indicating a "L" level via the transfer gate SW111 to the GDB0.

In a period for pulse generation for a second WE signal (period (2)), or to describe more precisely, in a first transition of a pulse for the second WE signal, in the state where the MASK0 signal indicates a "L" level and at the same time the Wdata signal indicates a "H" level, output ("L" level) from the NAND gate 172 and output ("H" level) from the inverter 173 do not change, and both the transfer gates SW100 and SW101 are turned ON. A difference between the period (1) is that, when the Wdata signal indicates a "H" level, a signal indicating the inverted "L" level is sent from the inverter 174 via the transfer gate SW110 to the GDB1 and a signal indicating the inverted "H" level is sent from the inverter 175 via the transfer gate SW111 to the GDB0.

In a period of pulse generation for a third WE signal (period (3)), or to describe more precisely, in a first transition of a pulse for the third WE signal, when the MASK0 signal indicates a "H" level, namely when a masking operation against data write is executed, if the Wdata signal indicates a "L" level, output from the NAND gate 172 indicates a "H" level irrespective of a level of the WE signal, the inverter 173 indicates a "L" level, and both the transfer gates SW110 and SW111 are turned OFF. Because of this configuration, signals outputted from the inverters 174 and 175 are not sent to the DGB1 and GDB0 respectively. Namely, the Wdata signal can not be sent to the GDB as write data, and because of this configuration, a masking operation against write data is executed. In FIG. 22, a portion indicated by dotted lines is a signal not inputted because of the masking operation.

Then in a period of pulse generation for a fourth signal (period (4)), or to describe more precisely, in a first transition of a pulse for the fourth WE signal, the MASK0 signal again indicates a "L" level, and the effect like that in the period (2) is obtained.

The sense buffer 151 receives a mask/disable signal (MASK0) outputted from the DQM input buffer 132 and executes an operation for disabling read data, but the operation for disabling read data can also be executed by controlling the I/O data buffer 131.

FIG. 23 is an explanatory view showing connection among the write amplifier/sense buffer 141, a I/O data buffer 131a in which it is possible to perform disable operation, and DQM input buffer 132. FIG. 23 especially shows configuration relating to the data input/output terminal DQ0, but any of other data input/output terminals DQ1 to DQ15 has the same configuration.

In the write amplifier/sense buffer 141, the write amplifier 152 has the configuration and executes the operations as shown in FIG. 21 and FIG. 22, but, different from the sense buffer 151 in FIG. 19, the sense buffer 151a does not receives the MASK0 signal, and the configuration comprising the inverter 161 and NAND gate 162 is required to be replaced with an inverter for receiving a RAED signal and inputting the inverted signal to the inverter 163 as well as to other control terminals of the transfer gates SW100 and SW101.

As shown in FIG. 23, the I/O data buffer 131a receives the mask/disable signal (MASK0) outputted from the buffer 132 and executes an operation for disabling data read according to a signal level of the MASK0 signal.

Next, detailed description is made for the I/O data buffer 131a. FIG. 24 is an explanatory view showing circuit configuration of the I/O data buffer 131a. Especially, FIG. 24 shows circuit configuration functioning when read data is outputted to a data input/output terminal. In FIG. 24, the I/O data buffer 131a comprises two transfer gates SW120 and SW121, two switching elements (herein, FET elements) TR120 and TR121, eight inverters 181, 184 to 190, one NAND gate 182, and one NOR gate 183.

The I/O data buffer 131a receives read data Rdata0 and Rdata 1 (each indicating the same signal level) outputted from the sense buffer 151a, and when the MASK0 signal outputted from the DQM input buffer 132 indicates a "L" level, outputs read data to the data input/output terminal DQ0 according to the signals indicated by the Rdata0 and Rdata1. On the other hand, when the MASK0 signal indicates a "H" level, Rdata0 and Rdata1 are prevented from passing through the NAND gate 182 and NOR gate 183 with both the TR120 and TR121 turned OFF, and the DQ0 is set in a high impedance (Hi-z) state.

At first, in the I/O data buffer 131a, the Rdata0 signal is inputted into one input terminal of the NAND gate 182. The other input terminal of the NAND gate 182 is connected to an output terminal of the inverter 181. The inverter 181 receives the MASK0 signal and outputs the inverted signal. With this configuration, the NAND gate 182 functions as an inverter for the Rdata0 signal when the MASK0 signal indicates a "L" level.

An output terminal of the NAND gate 182 is connected to one contact terminal of the transfer gate SW120, while the other contact terminal of the transfer gate SW120 is connected to an input terminal of the inverter 185. The inverter 185 outputs an inverted signal of a signal received from the transfer gate SW120, and inputs the inverted signal to an inverter 189. The inverter 185 has the output terminal connected to an input terminal of the inverter 186, and also has the input terminal connected to an output terminal of the inverter 186. Namely, because of the configuration comprising the inverter 185 and inverter 186, a latch function against a signal outputted from the other contact terminal of the transfer gate SW120 is realized.

An output terminal of the inverter 185 is connected to an input terminal of the inverter 189, and a signal outputted from the inverter 185 is inverted by the inverter 189. An output terminal of the inverter 189 is connected to a G terminal of the switching element TR120. The switching element TR120 is turned ON or OFF according to a signal level at the G terminal.

On the other hand, the Rdata1 signal is inputted to one input terminal of the NOR gate 183. The other input terminal of the NOR gate 183 receives the MASK0 signal. Thus, the NOR gate 183 functions as an inverter against the Rdata1 signal when the MASK0 signal indicates a "L" level.

An output terminal of the NOR gate 183 is connected to one contact terminal of the transfer gate SW121, while the other contact terminal of the transfer gate SW121 is connected to an input terminal of the inverter 187. The inverter 187 outputs an inverted signal of a signal inputted from the transfer gate SW121, and inputs the inverted signal to the inverter 190. Herein the inverter 187 has the output terminal connected to an input terminal of the inverter 188, and has the input terminal connected to an output terminal of the inverter 188. Namely, because of the configuration comprising the inverter 187 and inverter 188, a latch function against a signal outputted from the other contact terminal of the transfer gate SW121 is realized.

An output terminal of the inverter 187 is connected to an input terminal of the inverter 190, and a signal outputted from the inverter 187 is inverted by an inverter 190. An output terminal of the inverter 190 is connected to a G terminal of the switching element TR121. The switching element TR121 is turned ON or OFF according to a signal level at the G terminal.

The switching element TR120 has the D terminal connected to a potential VCC indicating a "H" level and the S terminal connected to the data input/output terminal DQ0 as well as to a D terminal of the switching element TR121. The switching element TR121 has the S terminal connected to a potential VSS indicated a "L" level. With this configuration, when the switching element TR121 is turned ON, a signal outputted to the data input/output terminal DQ0 indicates a "L" level at the same potential as the potential VSS. When the switching element TR121 is turned ON and at the same time the switching element TR121 is turned OFF, a signal outputted to the data input/output terminal DQ0 indicates a "H" level at the same potential as the potential VCC.

Also the clock signal (CLK) described above is inputted to the I/O data buffer 131a, and this clock signal (CLK) is inputted to one control terminal of each of the transfer gates SW120 and SW121. Further, an output terminal of the inverter 184 is connected to the other control terminal of each of the transfer gates SW120 and SW121, and the clock signal (CLK) is inputted to an input terminal of the inverter 184. With this configuration, the transfer gates SW120 and SW121 are repeatedly turned ON and OFF in synchronism to the clock signal (CLK). Therefore, the level of a signal outputted to the data input/output terminal DQ0 changes according to the MASK0 signal, Rdata0 signal and Rdata1 signal.

FIG. 25 is a time chart showing signals inputted into and outputted from the I/O data buffer 131a (CLK signal, MASK0 signal, Rdata0 signal and Rdata1 signal).

In FIG. 25, in a period of pulse generation for a first CLK signal (period (1)), or to describe more precisely, in a first transition of a pulse for the first CLK signal, both the transfer gates SW120 and SW121 are turned ON, and when the MASK0 signal indicates a "L" level, namely when an operation for disabling data read is not executed and at the same time the Rdata0 signal indicates a "L" level, also the Rdata1 signal indicates a "L" level. In this case, output from the inverter 181 indicates a "H" level, output from the NAND gate 182 indicates a "H" level, and the signals are inputted to one contact terminal of the transfer gate SW120. At this point of time, as the transfer gate SW120 is ON, output ("H" level) from the NAND gate 182 is inputted as it is to the inverter 185.

A signal outputted from the inverter 185 is inverted to a "L" level, and then it is inputted to the inverter 189. This "L" level signal is inverted by the inverter 189 and finally becomes a "H" level signal to turn OFF the switching element TR120.

Output from the NOR gate 183 indicates a "H" level, and is inputted to one contact terminal of the transfer gate SW121. As the transfer gate SW121 is still ON, output ("H" level" from the NOR gate 183 is inputted as it is to the inverter 187.

A signal inputted from the inverter 187 is inverted to a "L" level and is inputted to the inverter 190. This "L" signal is inverted by the inverter 190 to a "H" level signal to turn ON the switching element TR121.

Thus the switching element TR120 is turned OFF with the switching element TR121 turned ON, so that a level of a signal outputted to the data input/output terminal DQ0 indicates a "L" level at the same potential as the potential VSS. Namely, a signal at a level indicated by the Rdata0 signal (Rdata1 signal) is outputted to the data input/output terminal DQ0.

Next, in a period of pulse generation for a second CLK signal (period (2)), or to describe more precisely, in a first transition of a pulse for the second CLK signal, both the transfer gates SW120 and SW121 are turned ON with the MASK0 signal still indicating a "L" level, and the Rdata0 signal indicates a "H" level, namely also the Rdata1 signal indicates a "H" level. In this case, both the Rdata0 signal and output from the inverter 181 indicate a "H" level, so that output from the NAND gate 182 indicates a "L" level and is inputted to one contact terminal of the transfer gate SW120. At this point of time, the transfer gate SW120 is ON, so that output ("L" level) from the NAND gate 182 is inputted as it is to the inverter 185.

A signal outputted from the inverter 185 is inverted to a "H" level, and is inputted to the inverter 189. This "H" level signal is inverted by the inverter 189 to a "L" level signal to turn ON the switching element TR120.

As the Rdata1 signal indicates a "H" level and the MASK0 signal indicates a "L" level, the NOR gate 183 outputs a "L" level signal, and the signal is inputted to one contact terminal of the transfer gate SW121. The transfer gate SW121 is ON, so that output ("L" level) from the NOR gate is inputted as it is to the inverter 187.

A signal outputted from the inverter 187 is inverted to a "H" level and is inputted to the inverter 190. This "H" level signal is inverted by the inverter 190 to a "L" level signal to turn OFF the switching element TR121.

Thus the switching element TR120 is turned ON and the switching element TR121 is turned OFF, so that a signal outputted to the data input/output terminal DQ0 indicates a "H" level at the same potential as VCC. Namely, a signal at a level indicated by the Rdata0 signal (Rdata1 signal) is outputted to the data input/output terminal DQ0.

Then in a period of pulse generation for a third CLK signal (period (3)), or to describe more precisely, in a first transition of a pulse for the third CLK signal, both the transfer gates SW120 and SW121 are turned ON, and when the MASK0 signal indicates a "H" level, namely when an operation for disabling data read and at the same time the Rdata0 signal indicates a "L" level, also the Rdata1 signal indicates a "L" level. In this case, both the Rdata0 signal and output from the inverter 181 indicate a "L" level, so that output from the NAND gate 182 indicates a "H" level and the output is inputted to one contact terminal of the transfer gate SW120. As the transfer gate SW120 is ON, output ("H" level) from the NAND gate 182 is inputted as it is to the inverter 185.

A signal outputted from the inverter 185 is inverted to a "L" level, and is inputted to the inverter 189. This "L" level signal is inverted by the inverter 189 to a "H" level signal to turn OFF the switching element TR120.

As the Rdata1 signal indicates a "L" level and the MASK0 signal indicates a "H" level, the NOR gate 183 outputs a "L" level signal, and the output is inputted to one contact terminal of the transfer gate SW121. The transfer gate S121 is turned ON, so that output ("L" level) from the NOR gate 183 is inputted as it is to the inverter 187.

A signal outputted from the inverter 187 is inverted to a "H" level and then is inputted to the inverter 190. This "H" level signal is inverted by the inverter 190 to a "L" level signal to turn OFF the switching element TR121.

Thus both of the switching elements TR120 and TR121 are turned OFF, and a signal outputted to the data input/output terminal DQ0 is set in the high impedance (Hi-z) state. Namely, a level of a signal outputted to the data input/output terminal DQ0 becomes unstable, and with this configuration an operation for disabling read data is executed.

Then in a period of pulse generation for a fourth CLK signal (period (4)), or to describe more precisely, in a first transition of a pulse for the fourth CLK signal, again the MASK0 signal indicates a "L" level and enters the state similar to that in the period (2).

Testing for checking operations of semiconductor memories including those each having a plurality of pins of data input/output terminals and also having a mask/disable terminal for selectively enabling data write and data read like the SDRAM as described above is generally carried out by using an IC tester having the terminal connection pins connected to terminals of the semiconductor memory.

However, there is a limit in a number of drives or comparators to which the IC tester is applicable, namely in a number of terminal connection pins, so that a number of semiconductor memory devices which can be tested simultaneously is limited. Especially, when in order to test a semiconductor memory device having the mask/disable terminal as described above, to test all of the semiconductor memory devices, terminal connection pins for testing must be prepared for all of the mask/disable terminals of the semiconductor memory devices, so that there is a limit in a number of semiconductor memory devices which can be tested simultaneously.

FIG. 26 is an explanatory view showing testing operations with an IC tester for a semiconductor memory according to the conventional technology, and shows how the IC tester is connected when the conventional type of semiconductor memory described above is tested with the IC tester. Although not shown in a figure, when testing is carried out with the IC tester, generally a plurality of semiconductor memory devices are set in receptacles respectively and tested simultaneously to reduce the testing time.

As shown in FIG. 26, when two semiconductor memory devices 191 and 192 are to be tested simultaneously, data input/output terminals DQ0 to DQ15 of each of the semiconductor devices are connected to a common data bus line, and also the /RAS, /CAS and /WE terminals are connected to a common control command line, so that a number of connection terminal pins of an IC tester required for the common data bus line and command control command line are sixteen (16) for the data input terminals DQ0 to DQ15 and three (3) for the /RAS, /CAS and /WE terminals.

Thus, a number of terminal connection pins required for the data bus line and control command line does not change according to a number of semiconductor memory devices to be tested simultaneously. On the other hand, each semiconductor device has two mask/disable terminals, and it is required to control the mask/disable terminals of each semiconductor memory device independently, so that totally four connection terminal pins must additionally be prepared for connection to DQML and DQMU terminals of each semiconductor memory device. When two mask/disable terminals of the semiconductor device 191 are connected to two mask/disable terminals of the semiconductor device 192, total twenty-three pins are required, and if a number of available terminal connection terminal pins in the IC tester is twenty three (23), three or more semiconductor devices can not simultaneously be connected to this IC tester for testing.

For simultaneously testing a plurality of semiconductor memory devices each having a mask/disable terminal or mask/disable terminals, the number of additionally required drivers/comparators for an IC tester can be computed through the expression: (a number of mask/disable terminals in each semiconductor memory device)×(a number of semiconductor memory devices to be tested). Thus, a number of semiconductor memory devices which can simultaneously be tested is reduced, and a time required for testing becomes disadvantageously longer. Especially, when a large number of semiconductor memory devices are tested, the problems described above becomes serious.

To solve the problem described above, it is conceivable to employ such a method as increasing a number of drivers/comparators or increasing data bus lines in a IC tester, or using an IC tester equipped with a sufficient number of drives/comparators, but such option or IC tester becomes very expensive and results in an increase in the facility cost, which is not preferable in an actual application.

SUMMARY OF THE INVENTION

It is an object of the present invention to provide a semiconductor memory making it possible for a large number of semiconductor memories to be simultaneously tested with an IC tester currently used and providing excellent convenience especially in testing.

With the present invention, it is possible to change allocation of data input/output terminals inhibited for data to be written therein or read out therefrom for each last/disable terminal, and even when use of one mask/disable terminal is inhibited, it is possible to control a mask/disable operation for the data input/output terminals allocated to the mask/disable terminal with other mask/disable terminal.

With the present invention, in the second operation mode (testing mode), a mask/disable operation for both the first and second data input/output terminal groups can be controlled with a first mask/disable terminal, so that a number of mask/disable terminals used in the second operation mode can be reduced and a number of semiconductor devices which can simultaneously be tested can be increased.

With the present invention, correspondence between data input/output terminal groups and mask/disable terminals can easily be changed according to an operation mode by switching connection between the first and second mask/disable terminals and first and second write/read control circuit sections with a changing unit.

With the present invention, by switching connection between the first and second mask/disable terminal and the first and second write/read control circuit sections with the changing units, correspondence between data input/output terminal groups and mask/disable terminals can easily be changed according to a particular operation mode.

Other objects and features of this invention will become apparent from the following description with reference to the accompanying drawings.

BRIEF DESCRIPTION OF THE DRAWINGS

FIG. 5 is an explanatory view showing a relation between a signal level of a test signal for the semiconductor memory according to Embodiment 1 and an ON/OFF state of transfer gates SW0 and SW1;

FIG. 10 is an explanatory view showing a relation between a signal level of a test signal for the semiconductor memory according to Embodiment 2 and an ON/OFF state of the transfer gates SW10 to SW13;

DESCRIPTION OF THE PREFERRED EMBODIMENTS

Figure 1:
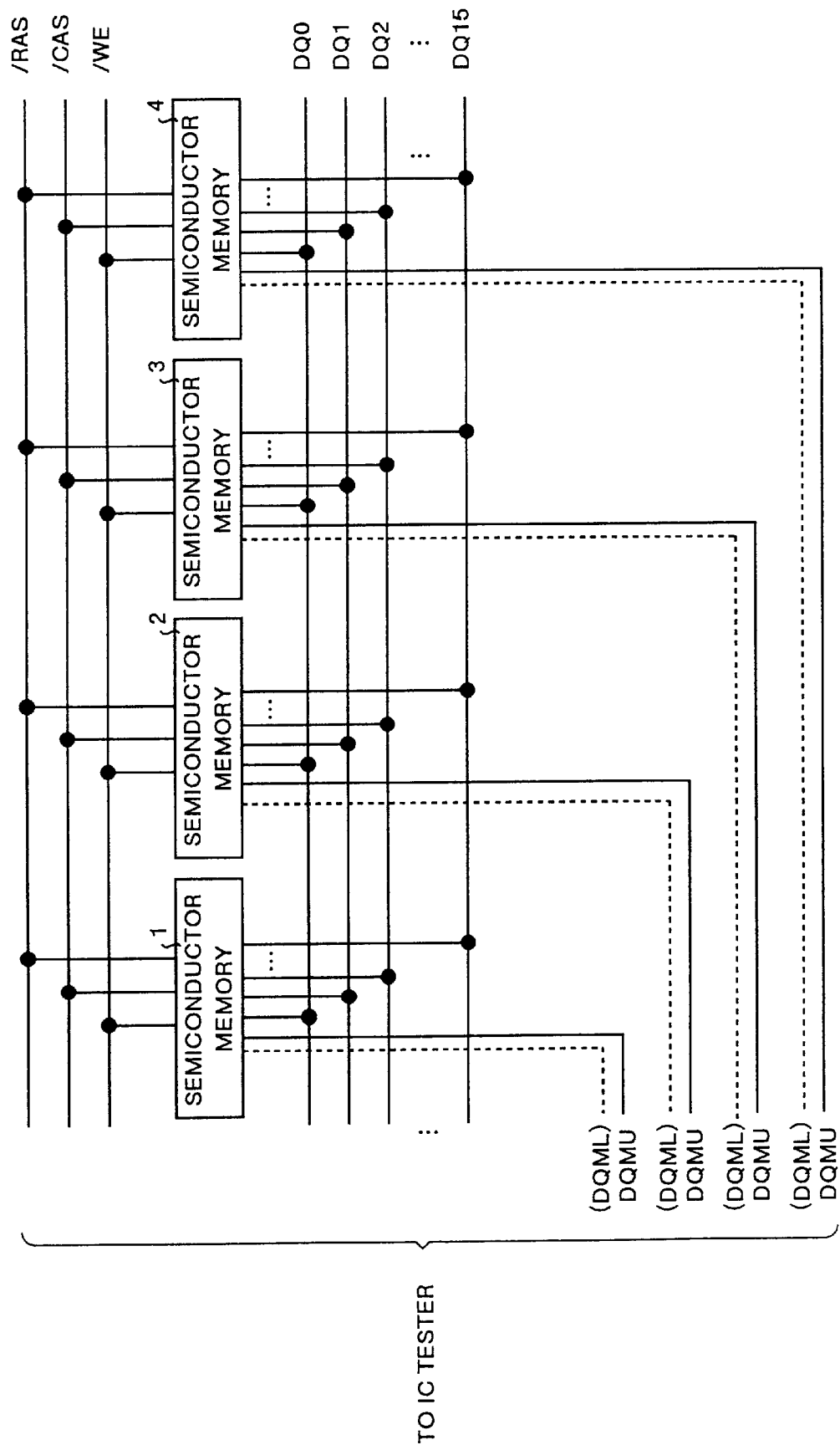
FIG. 1 is an explanatory view showing connection between a semiconductor memory device according to Embodiment 1 of the present invention and an IC tester.

Detailed description is made hereinafter for embodiments of the semiconductor memory according to the present invention with reference to the drawing. It should be noted that the present invention is not limited by the embodiments. Description of the semiconductor memory according to the present invention is made below with a reference to a SDRAM, which operates in synchronism to an external clock, as an example thereof.

FIG. 1 is an explanatory view showing connection between an IC tester and each of semiconductor memory devices 1 to 4 in testing of semiconductor memory devices each with the semiconductor memory according to the present invention incorporated therein (in this embodiment, a packaged SDRAM) with the IC tester. When testing with the IC tester, generally a plurality of semiconductor memory devices are connected to receptacles thereof to simultaneously test the semiconductor memory devices to shorten the time required for the testing.

Figure 26:
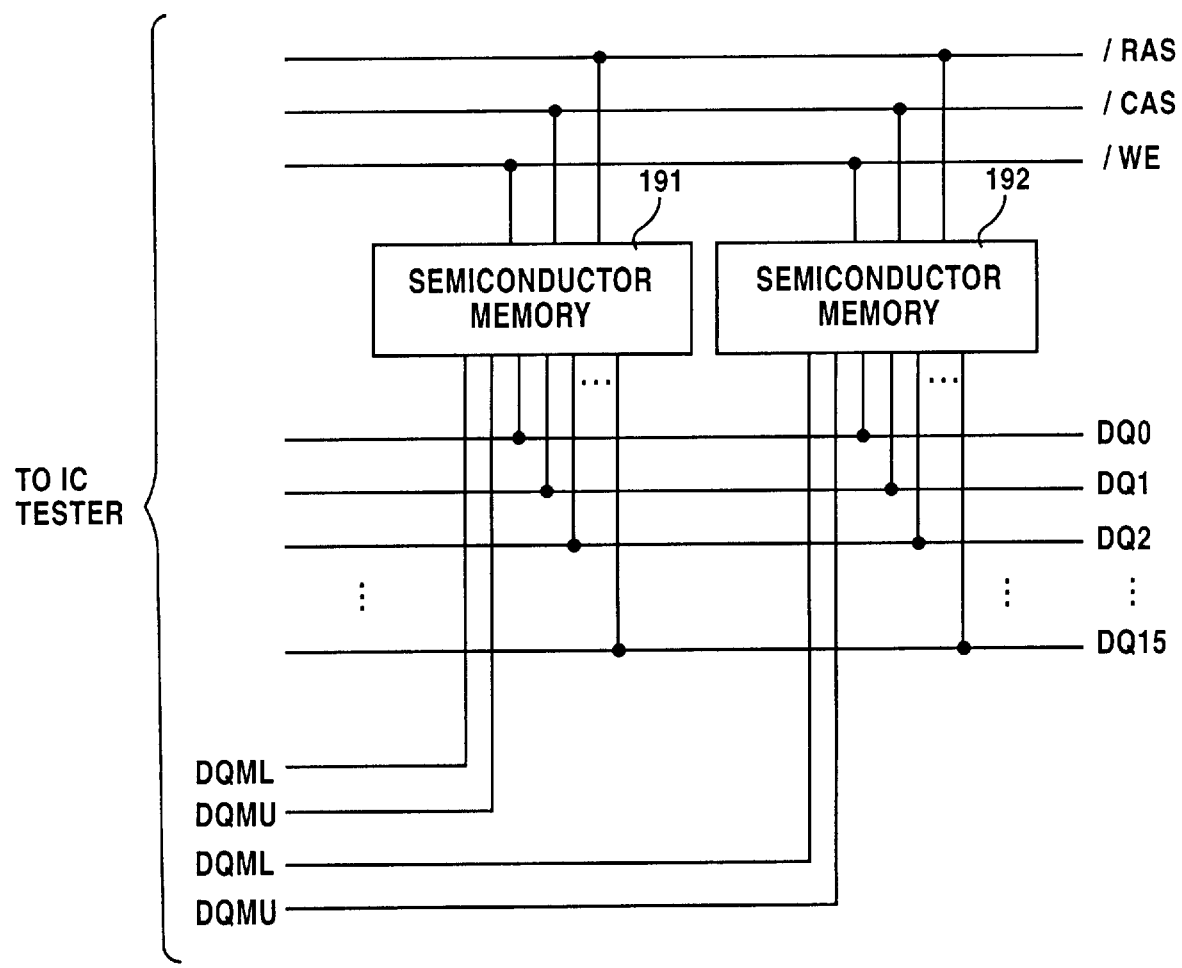
FIG. 26 is an explanatory view showing testing operations with an IC tester for the semiconductor memory based on the conventional technology.

Configuration shown in FIG. 1 is different from the example of conventional technology shown in FIG. 26 in that, although a DQML signal and a DQMU signal are supplied from the IC tester to each device in the example of conventional technology, in this invention, as shown in FIG. 1, only one DQM signal (for instance, a DQMU signal) is supplied from the IC tester to each device.

In FIG. 1, sixteen data input/output terminals DQ0 to DQ15 of a semiconductor memory device are connected to a shared data bus line, and also the /RAS, /CAS, and /WE terminal are connected to a shared control command line, so that nineteen connection terminal pins are required for the IC tester in this stage.

In addition, connection terminal pins for connected to mask/disable terminals of each semiconductor memory device are required, and in the semiconductor memory device according to the present invention, a testing operation can be executed under a condition that when only one of the two mask/disable terminals of each semiconductor memory device is connected to the IC tester, and assuming that twenty-three connection terminal pins are available in the IC tester, a mask/disable terminal of each semiconductor memory device can be allocated to each of the remaining four connection terminal pins.

As shown in FIG. 1, a DQMU terminal of each of the semiconductor memory devices 1 to 4 is connected to the IC tester, while a DQML terminal of each semiconductor memory device is not connected to the IC tester. Because of this configuration, if twenty-three connection terminal pins are available in the IC tester, according to the conventional technology, only two units of semiconductor memory device can simultaneously be tested, but in this embodiment, four semiconductor memory device can simultaneously be tested. Thus, with the semiconductor memory device according to this embodiment, it is possible to double a number of semiconductor memories which can be tested simultaneously with an IC tester as compared to the conventional technology, so that substantial reduction of a time required for testing as well as of testing cost is possible without making new investment for an IC tester.

When only either one of a DQML signal and a DQMU signal is supplied to each device, control for a mask/disable operation can not be provided to half of the plurality of data input/output terminals, but in the preset invention, control for a mask/disable operation can be provided to all of data input/output terminals in a device according to one DQM signal (for instance, a DQMU signal) supplied from the IC tester, so that the problem described above does not occur. Detail description is made below for the configuration.

Figure 2:
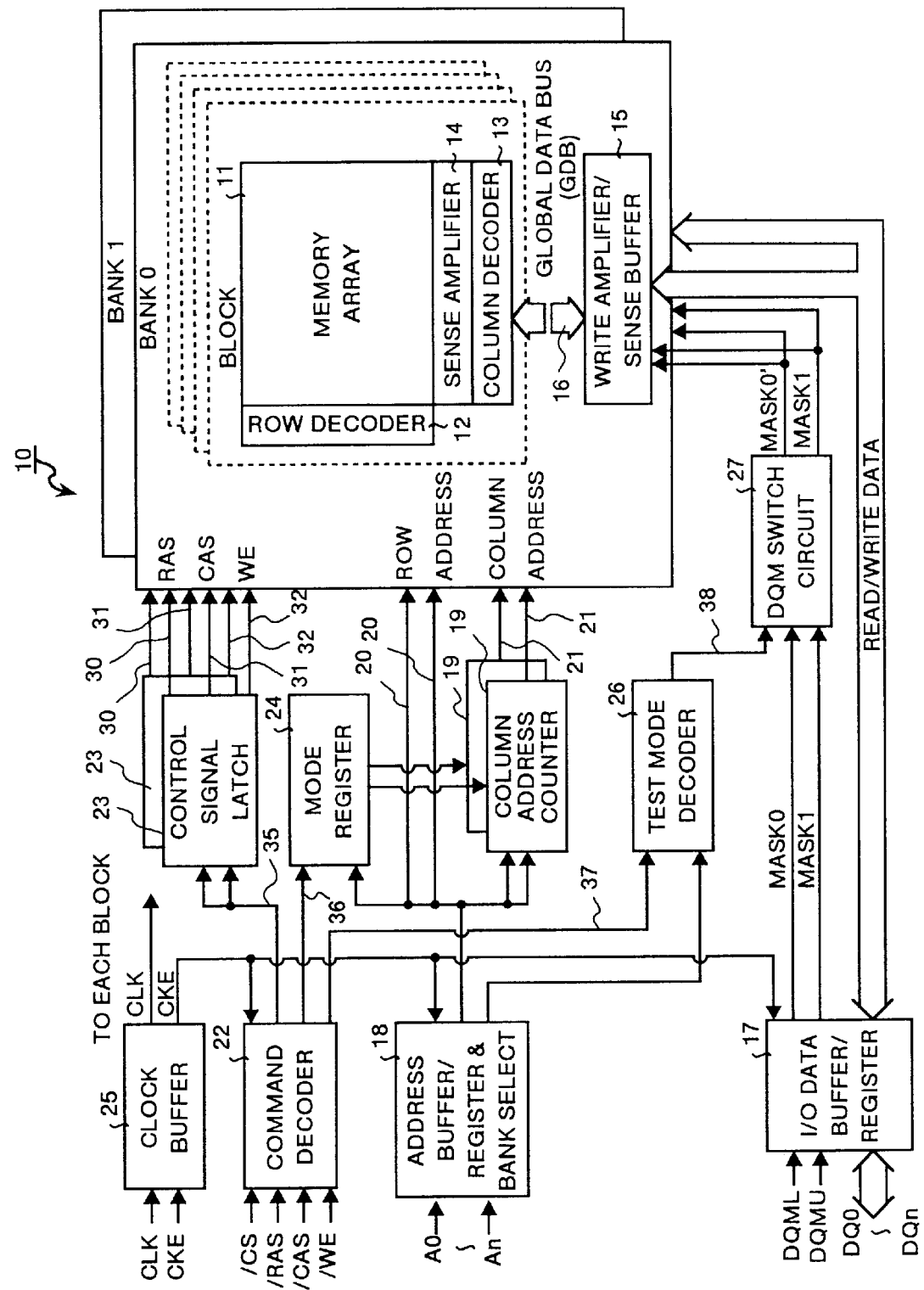
FIG. 2 is a block diagram showing general configuration of the semiconductor memory according to Embodiment 1.

FIG. 2 is a block diagram showing general configuration of a semiconductor memory according to Embodiment 1 of the present invention. In FIG. 2, a SDRAM 10, which is a semiconductor memory, shows a SDRAM similar to the SDRAM described a the conventional technology and based on the memory bank system in which, by using a MPU, it is possible to manage a memory capacity larger than an address space of the MPU.

Figure 16:
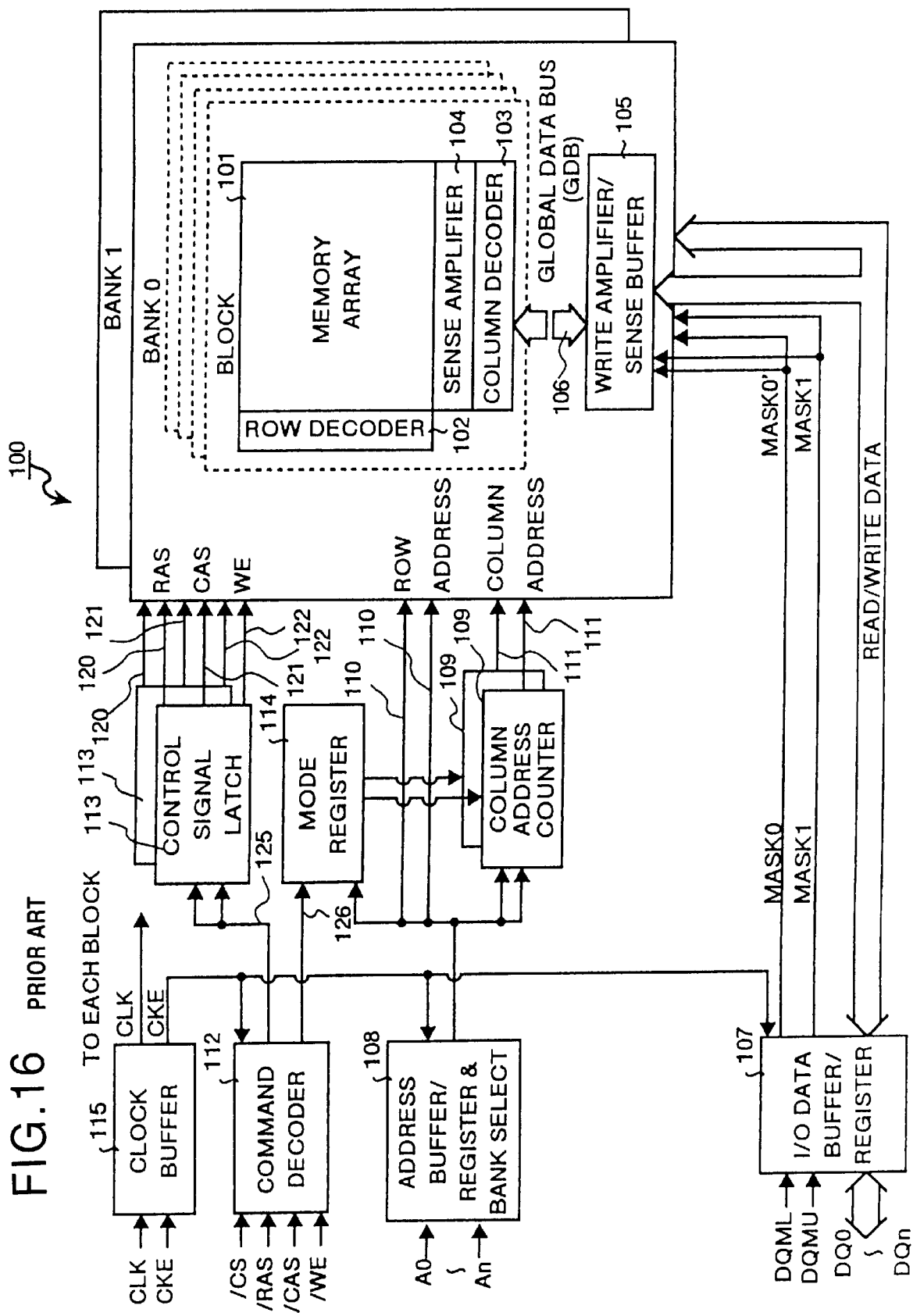
FIG. 16 is a block diagram showing general configuration of a semiconductor memory based on the conventional technology.
Figure 17:
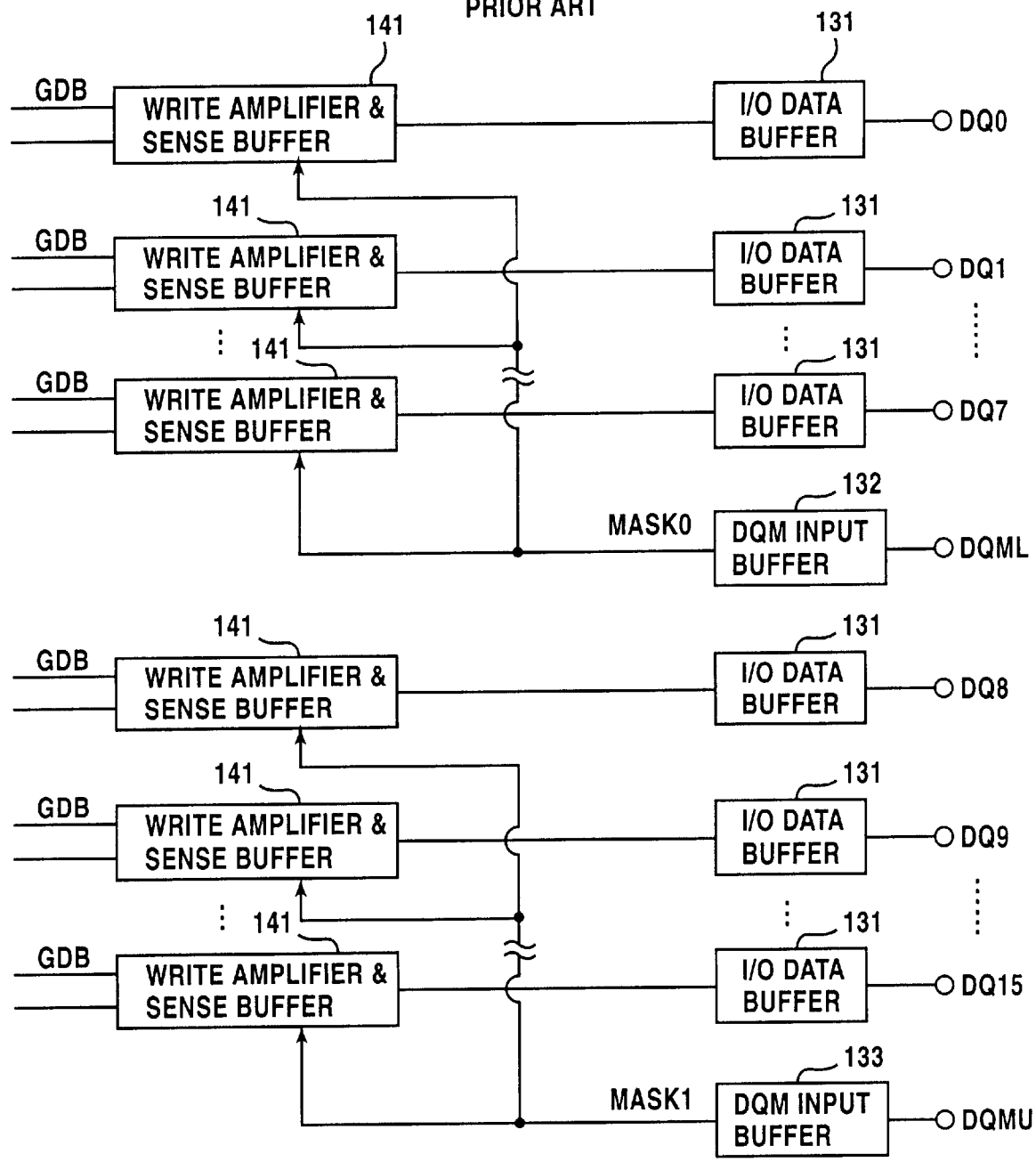
FIG. 17 is an explanatory view showing the key sections of the semiconductor memory based on the conventional technology.
Figure 18:
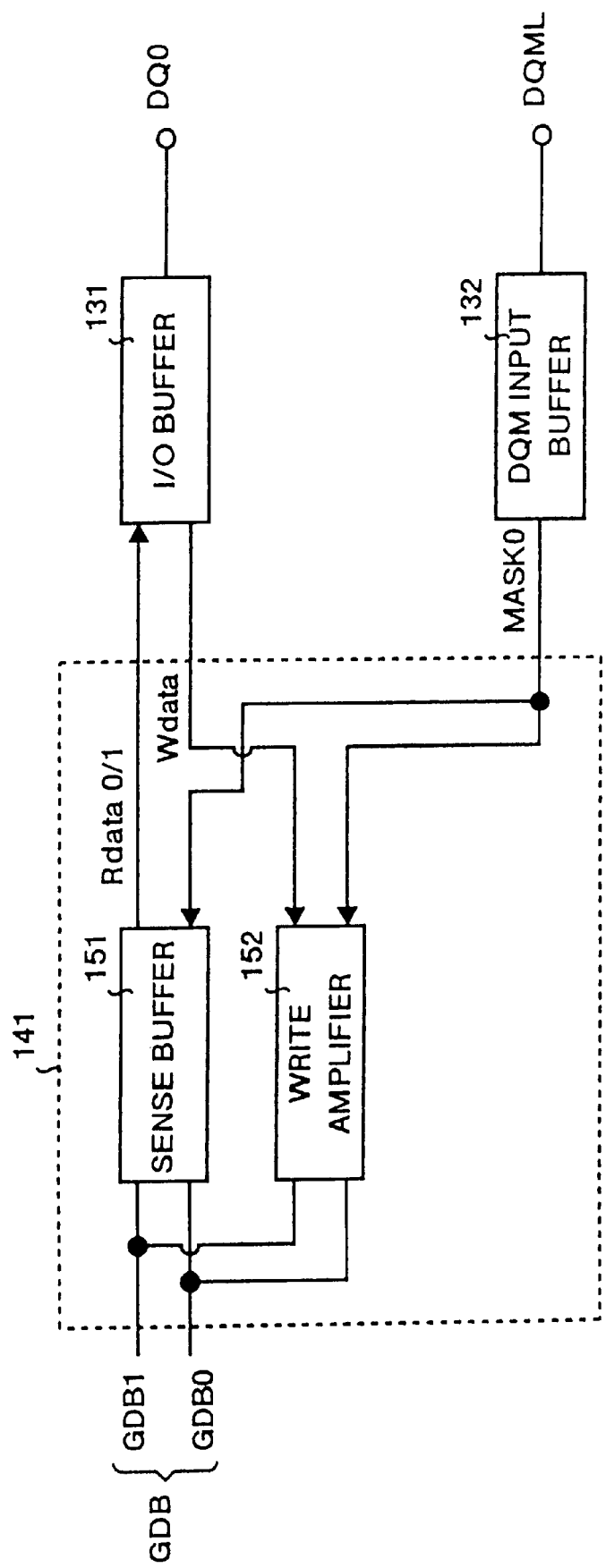
FIG. 18 is an explanatory view showing connection between key sections in the semiconductor memory based on the conventional technology.
Figure 19:
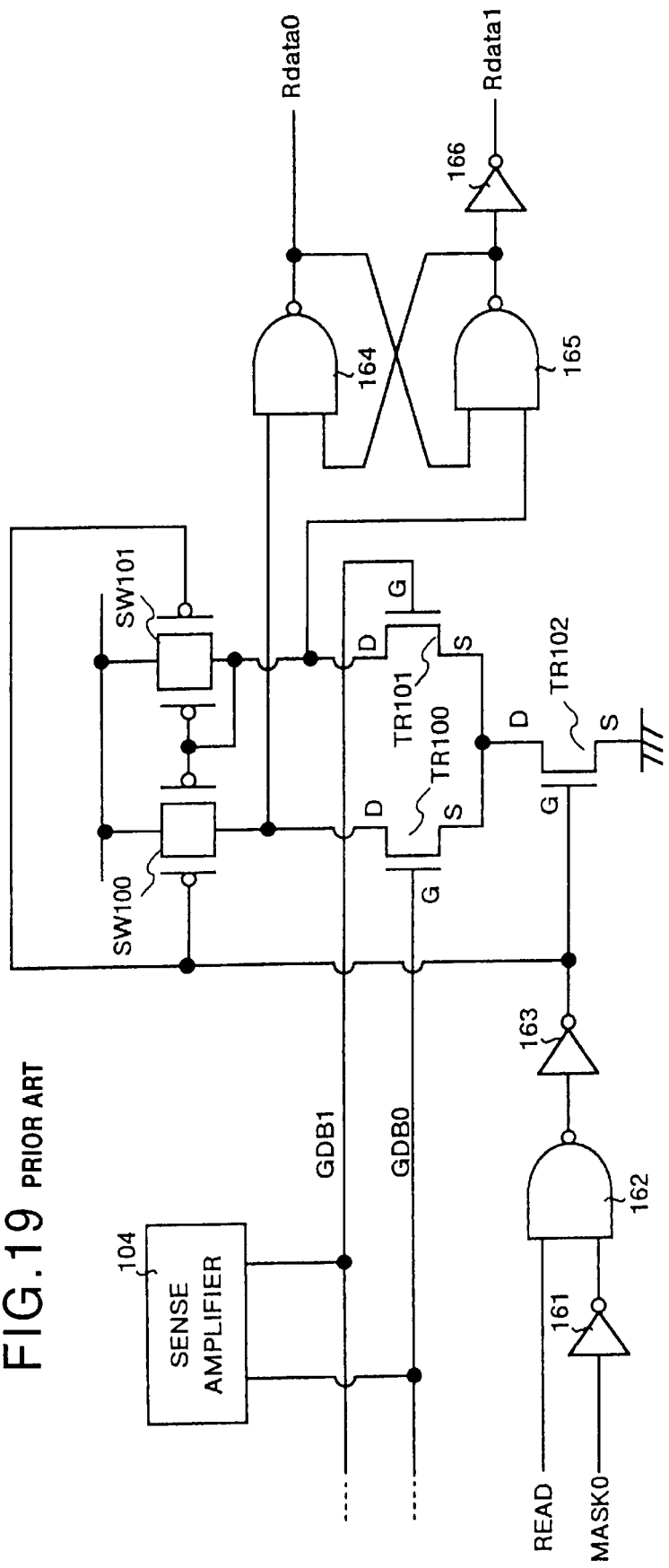
FIG. 19 is an explanatory view showing circuit configuration of a sense buffer in the semiconductor memory based on the conventional technology.
Figure 20:
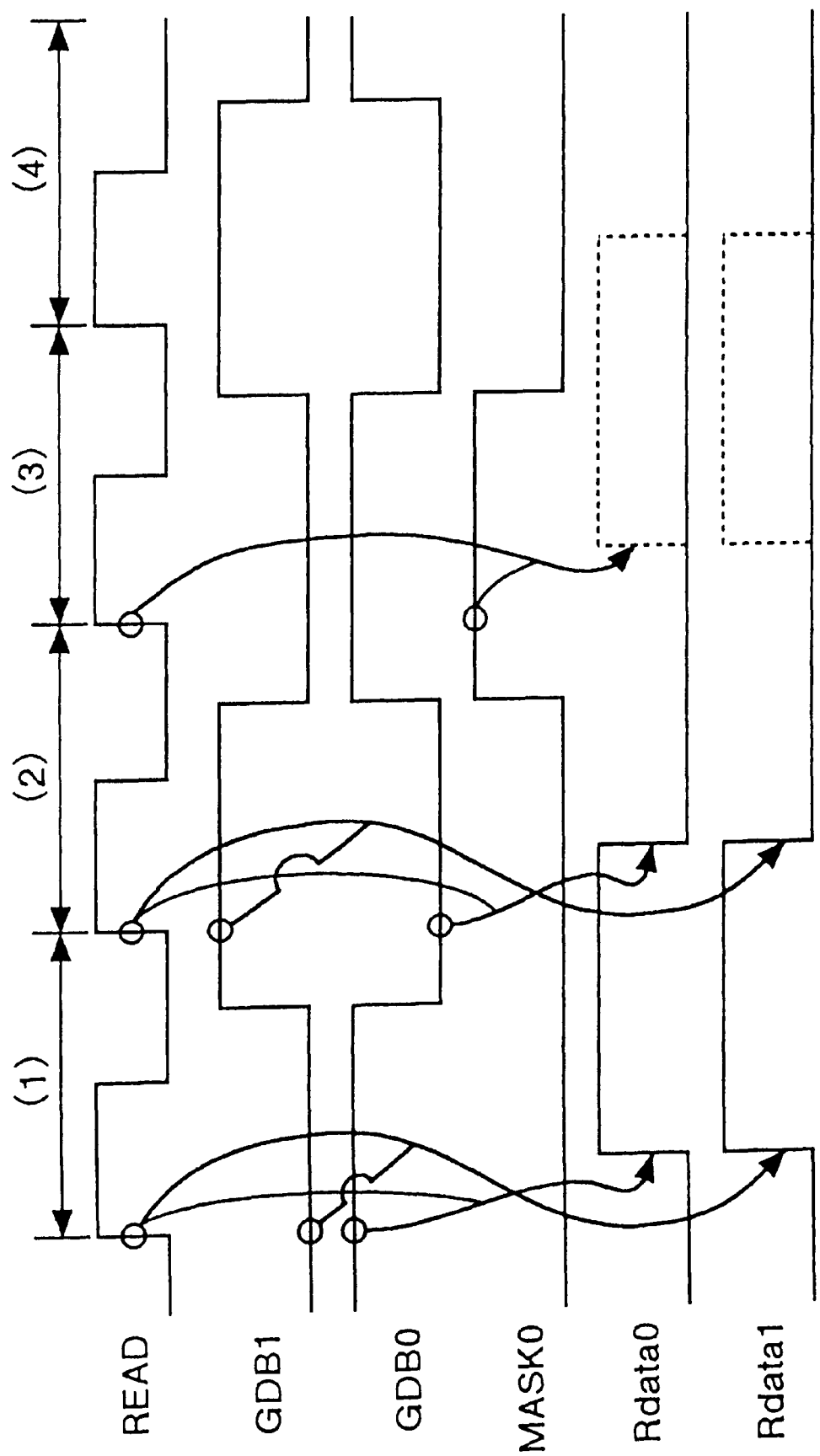
FIG. 20 is a time chart for signals inputted to or outputted from a sense buffer in the semiconductor memory based on the conventional technology.
Figure 21:
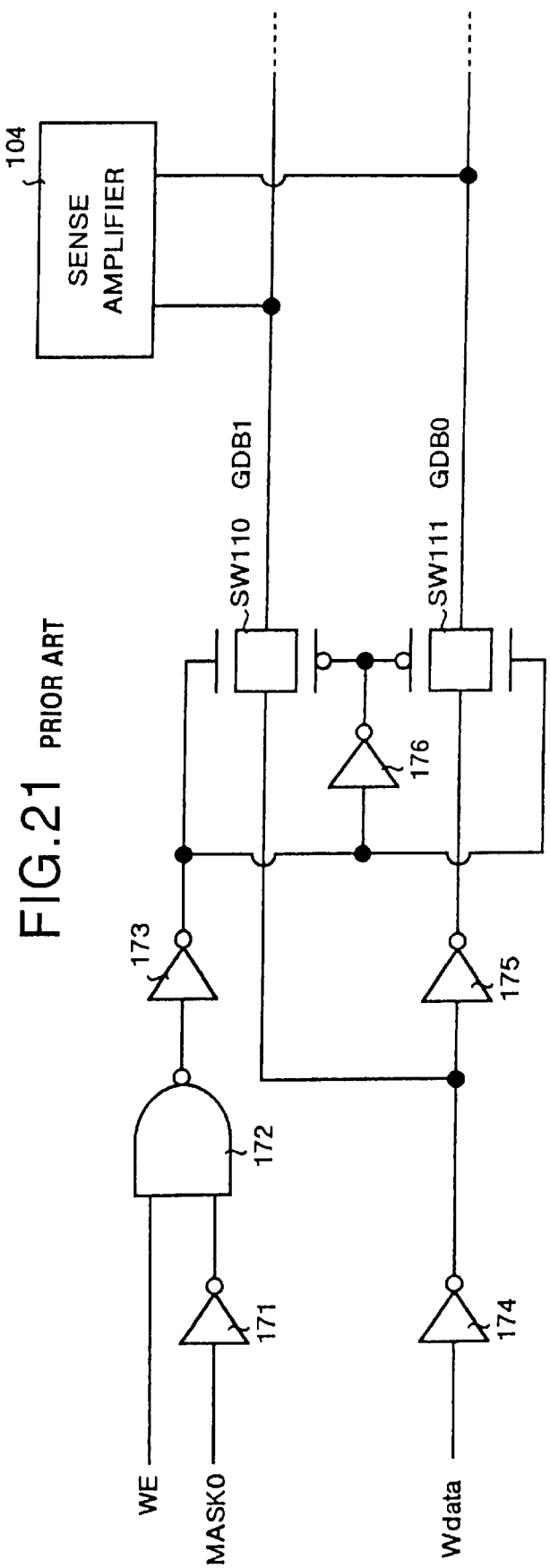
FIG. 21 is an explanatory view showing circuit configuration of a write amplifier in the semiconductor memory based on the conventional technology.
Figure 22:
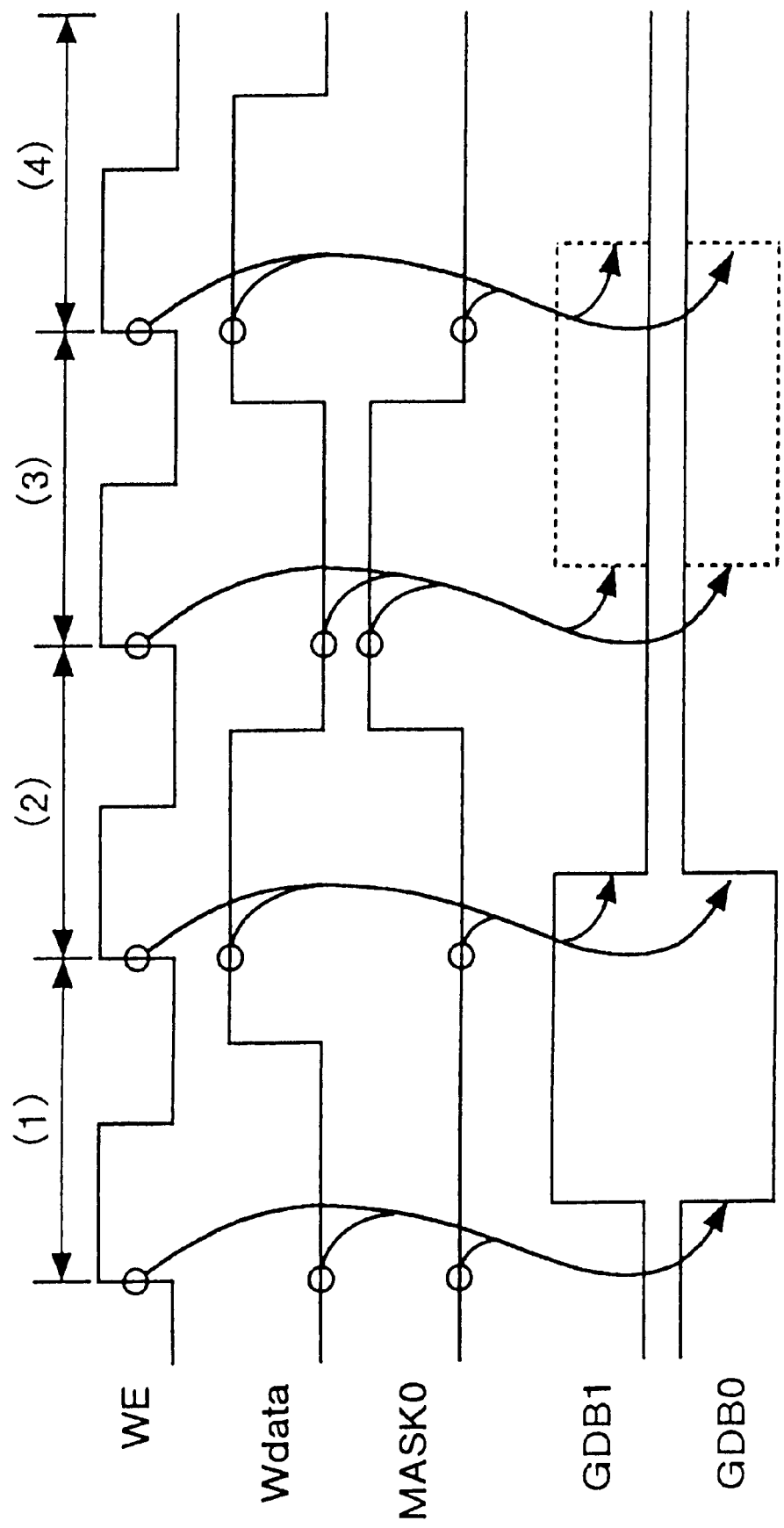
FIG. 22 is a time chart for signals inputted to or outputted from a write amplifier in the semiconductor memory based on the conventional technology.

The SDRAM according to the present invention is different from the conventional technology shown in FIG. 16 in that a test mode decoder 26 and a DQM switch circuit 27 are provided, and that a DQML signal and a DQMU signal inputted from the outside are given in the normal mode as they are as a MASK0 signal and a MASK1 signal to each bank, and either one of the DQML signal and DQMU signal is given in the testing mode to both of the MASK0' signal and MASK1 signal, which are supplied to each bank.

In the SDRAM 10 shown in FIG. 2, a memory array, in which memory cells are arranged in a matrix form, is divided into two banks (bank 0 and bank 1). Further, each bank is divided to a plurality of blocks. Each block has a row decoder 12 and a column decoder 13, and selects one memory cell from a memory array 11 in each block.

Herein, the row decoder 12 is a circuit which selects one of word lines (not shown) each identifying a memory cell in the row direction in response to a row address signal 20. The column decoder 13 is a circuit which selects one of bit lines (not shown) each identifying a memory cell in the column direction in response to a column address signal 21. A sense amplifier 14 for amplifying an electric charge stored in a memory cell is connected to each bit line.

For instance, in a case of 1M-bit SDRAM, each of the bank 0 and bank 1 has a memory space of 64K bytes (512K bits), and each bank is quartered to blocks each having a memory capacity of 128K bits (128K memory cell). In this case, a row decoder for each block identifies one word line from 512 row addresses, and a column decoder/sense amplifier identifies one bit line from 256 column addresses.

In the bank 0 or bank 1, data in a memory cell identified by the row decoder 12 and column decoder 13 in response to a data read command is inputted via a global data bus (GDB) 16 into the write amplifier/sense buffer 15 ( it should be noted that, in this case, the sense buffer functions). Data comprising a plurality of bits can be inputted into or outputted from the SDRAM 10, and when 16-bit data is inputted or outputted, data for 2 bytes in a memory cell identified according to the inputted row address signal 20 and column address signal 21 can be latched in the write amplifier/sense buffer 15 and can be outputted in parallel.

The read data latched in the write amplifier/sense buffer 15 is transferred to an I/O data buffer/register 17 and it is outputted from the data input/output terminals DQ0 to DQn (n=15 in the case described above) of the I/O data buffer/register 17.

On the other hand, when the bank 0 or bank 1 receives a data write command, write data inputted from the data input/output terminals DQ0 to DQn (n=15 in the case described above) of the I/O data buffer/register 17 is transferred to the write amplifier/sense buffer 15 (it should be noted that, in this case, the write amplifier functions). The data transferred to the write amplifier/sense buffer 15 is written via the GDB 16 in a memory cell identified by the row decoder 12 and column decoder 13.

Like in the case of data read described above, when, for instance, 16-bit data is inputted or outputted, 2-byte (16-bit) data latched in the write amplifier/sense buffer 15 can be inputted in a memory cell identified according to the inputted row address signal 20 and column address signal 21.

The row address signal 20 and column address signal 21 are generated according to signals inputted from address terminals A0 to An of an address buffer/register and bank select 18. Actually, the row address signal 20 and column address signal 21 are generated by fetching address signals inputted to the address terminals A0 to An by way of multiplexing according to a latch timing depending on an active instruction signal and a read/write instruction signal. It should be noted that An, the top bit of an address is used for a bank select to select either one of the bank 0 or bank 1.

A RAS signal 30, a CAS signal 31 and a WE signal 32 are inputted into the bank 0 and bank 1, and a control instruction such as a data write instruction or a read instruction is decided according to a combination of these three signal. Especially, the operations of the write amplifier/sense buffer 15 are decided according to this control instruction.

For instance, when the control instruction indicates a write instruction, the write amplifier/sense buffer 15 operates as a write amplifier, fetches data comprising a plurality of bits from the I/O data buffer/register 17, and transfers the fetched data via the GDB 16 to the sense amplifier 14 or the memory array 11. On the other hand, when the control instruction indicates a read instruction, the write amplifier/sense buffer 15 operates as a sense buffer, fetches data via the GDB 16 from the sense amplifier 14 or memory array 11, and transfers the fetched data to the I/O data buffer/register 17.

The RAS signal 30, CAS signal 31 and WE signal 32 inputted into the bank 0 and bank 1 are outputted from a control signal latch 23. The control signal latch 23 receives a command signal 35 from a command decoder 22, latches a control command indicated by the command signal 35, generates and outputs each signal so that the latched control instruction can be expressed with a combination of the three signals of RAS signal 30, CAS signal 31 and WE signal 32.

The command decoder 22 receives a /CS signal, a /RAS signal, a /CAS signal and a /WE signal, decides a control instruction according to a combination of these signals, and outputs a command signal 35 indicated by the control instruction. The command decoder 22 decides an access mode for data according to a combination of the /CS signal, /RAS signal, /CAS signal and /WE signal, and outputs a mode signal 36 indicating the access mode. This mode signal 36 is inputted into a mode register 24.

The mode register 24 receives the mode signal 36 and address signals A0 to An transferred via the address buffer/register & bank select 18 and temporally stores the signals therein. The column address counter 19 determines an access mode such as a burst read mode according to the mode signal and an address signal stored in the mode register 24, generates and outputs a column address signal 21 corresponding to the access mode.

The SDRAM 10 operates according to a synchronous signal (CLK) given from the outside such as, for instance, a system clock from a MPU, and operates at a high speed. A clock buffer receives a clock enable signal (CKE) for controlling output of a clock signal (CLK) given from the outside and the clock signal, and supplies the received clock signal to each circuit.

The clock buffer 25 provides the received clock enable signal to the command decoder 22, address buffer/register & bank select 18 and I/O data buffer/register 17, and when the circuits are not to be operated, terminates supply of the clock signal to realize reduction of power consumption.

The I/O data buffer/register 17 receives a mask/disable signal from a mask/disable terminal. Specifically, the I/O data buffer/register 17 receives a signal for masking/disabling upper bits of the data signals DQ0 to DQn as a DQMU signal from the DQMU terminal. Also the I/O data buffer/register 17 receives a signal for masking/disabling lower bits of the data signals DQ0 to DQn as a DQML signal from the DQML terminal.

Further, the SDRAN 10 according to the present invention comprises a test mode decoder 26 and a DQM switch circuit (mask/disable switch circuit) 27, and the test mode decoder 26 and DQM switch circuit 27 output the MASK0' signal and MASK1 signal according to either one of the DQML signal and DQMI signal in testing with an IC tester. The test mode decoder 26 receives a test instruction signal (TCS signal) 37 decided and outputted according to a combination of the /RAS signal, /CAS signal and /WE signal and a portion or all of the address signals A0 to An inputted to the address buffer/register & bank select 18, and outputs the test signal 38 to the DQM switch circuit 27.

The test instruction signal (TCS signal) 37 is an operation mode signal for testing a semiconductor memory with an IC tester, which is a signal outputted from the command decoder 22 when the semiconductor memory is set in an IC tester and the /RAS signal, /CAS signal and /WE signal each indicating the test mode are transmitted from the IC tester.

An address signal given from the address buffer/register & bank select 18 to the test mode decoder 26 specifies a type of testing to be executed actually. The test mode decoder 26 receives a test instruction signal 37 indicating a testing mode from the command decoder 22, and activates the test signal 38 when a signal specifying the write mask/read disable testing is received from the address buffer/register & bank select 18.

The DQM switch circuit 27 receives the test signal 38 outputted from the test mode decoder 26 and the DQML signal (MASK0) and DQMU signal (MASK1) inputted via the I/O data buffer/register 17, outputs the MASK0 signal and MASK1 signal as they are in the normal mode according to a signal level of the test signal 38, and simultaneously outputs the DQML signal (MASK0') and DQMU signal (MASK1') according to the test signal 38 and MASK0 signal or MASK1 signal. It should be noted that, in the embodiment shown in FIG. 2, the DQM switch circuit 27 outputs the MASK1 signal as it is regardless of whether the operation mode is an normal mode or testing mode, but outputs the MASK0 signal as it is in the normal mode, and generates the MASK0' signal in the testing mode according to the test signal 38 and MASK1 signal.

The MASK0' signal and MAKS1 signal outputted from the DQM switch circuit 27 are transmitted to the bank 0 and bank 1 and are inputted to the write amplifier/sense buffer 15 in each bank. When the MASK1 signal indicates a "H" level and at the same time a control instruction given to the bank 0 and bank 1 indicates a write instruction, the write amplifier/sense buffer 15 masks writing data corresponding to upper bits of the data signal DQ0 to DQn, namely data write in the write amplifier/sense buffer is inhibited. When the MASK0' signal indicates a "H" level and at the same time a control instruction given to the bank 0 and bank 1 indicates a write instruction, the write amplifier/sense buffer 15 masks data corresponding to the lower bits of the data signals DQ0 to DQn, namely data write in the write amplifier/sense buffer is inhibited.

When the MASK1 signal indicates a "H" level and a control instruction given to the bank 0 and bank 1 indicates a read instruction, the write amplifier/sense buffer 15 masks data corresponding to the upper bits of the data signals DQ0 to DQn, namely data read to the write amplifier/sense buffer 15 is inhibited. When the MASK0' signal indicates a "H" level and at the same time a control instruction give to the bank 0 and bank 1 indicates a read instruction, the write amplifier/sense buffer 15 masks data corresponding to lower bits of the data signals DQ0 to DQn, namely data read to the write amplifier/sense buffer 15 is inhibited.

It should be noted that, a refresh controller for reading out data written in a memory cell into a bit line, amplifying the data signal with a sense amplifier, and rewriting the data again in the bit line, namely for refreshing is required to an actual SDRAM, but in FIG. 2 the refresh controller is omitted to simplify description concerning operations of the SDRAM.

Figure 3:
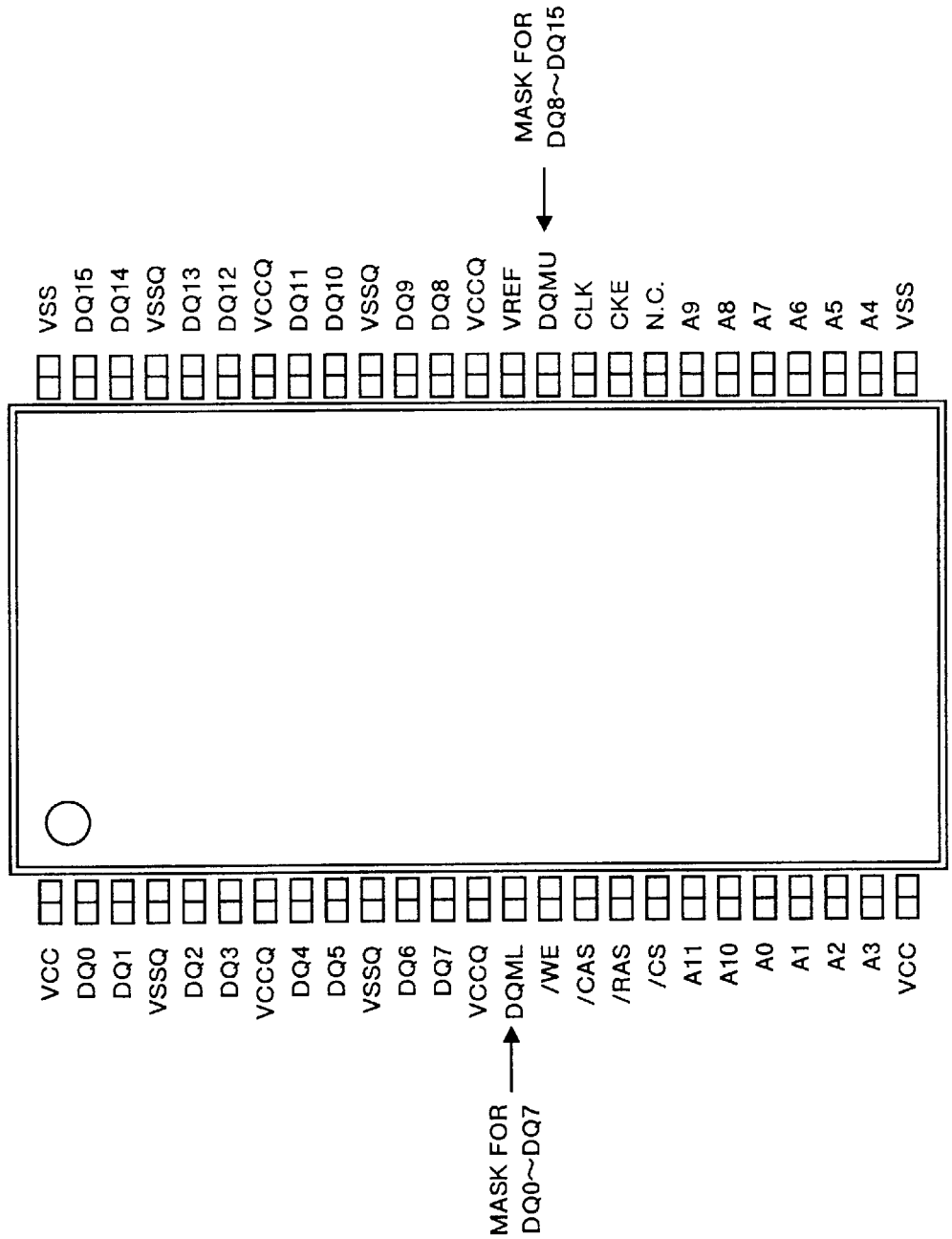
FIG. 3 is a schematic view showing a semiconductor memory device according to Embodiment 1 packaged therein.

FIG. 3 is a view showing general configuration of a semiconductor memory device packaged therein according to Embodiment 1, and shows a state wherein the SDRAM 10 shown in FIG. 2 is packaged (described as SDRAM device hereinafter). In FIG. 3, the SDRAM comprises fifty pin terminals.

Of the fifty pin terminals, pin terminals DQ0 to DQ15 are data input/output terminals and are connected to the I/O data buffer/register 17 shown in FIG. 2, and can input or output 16-bit data in parallel. Terminals A0 to A10 are address terminals, and A11 is a terminal for the bank select described above. The terminals A0 to A11 are connected to the address buffer/register & bank select 18 shown in FIG. 2.

The /WE, /CAS and /RAS are terminals for receiving a control clock for the SDRAM. The /WE terminal relates to a data write/read operation, the /CAS terminal relates to latching of a column address, and /RAS terminal relates to latching of a row address. Furthermore, the /CS terminal is a chip select terminal for setting each SDRAM device in an active state when a SDRAM module is constructed with a plurality of SDRAM devices. The signals inputted from the four terminals of /WE, /CAS, /RAS and /CS are guided to the command decoder 22 shown in FIG. 2, and an operation mode of the SDRAM such as the control instruction or access mode as described above is decided according to a combination of the signal.

The CLK and CKE are terminals connected to the clock buffer 25 shown in FIG. 2, and give a synchronous clock signal (CLK) and a clock enable signal (CKE) for the CLK respectively. The DQML and DQMU are mask/disable terminals, and are connected to the I/O data buffer/register 17 shown in FIG. 2. In the SDRAM device shown in FIG. 3, the DQML terminal controls mask/disable of the data input/output terminals DQ0 to DQ7, while the DQMU terminal controls mask/disable of the data input/output terminals DQ13 to DQ15.

Figure 4:
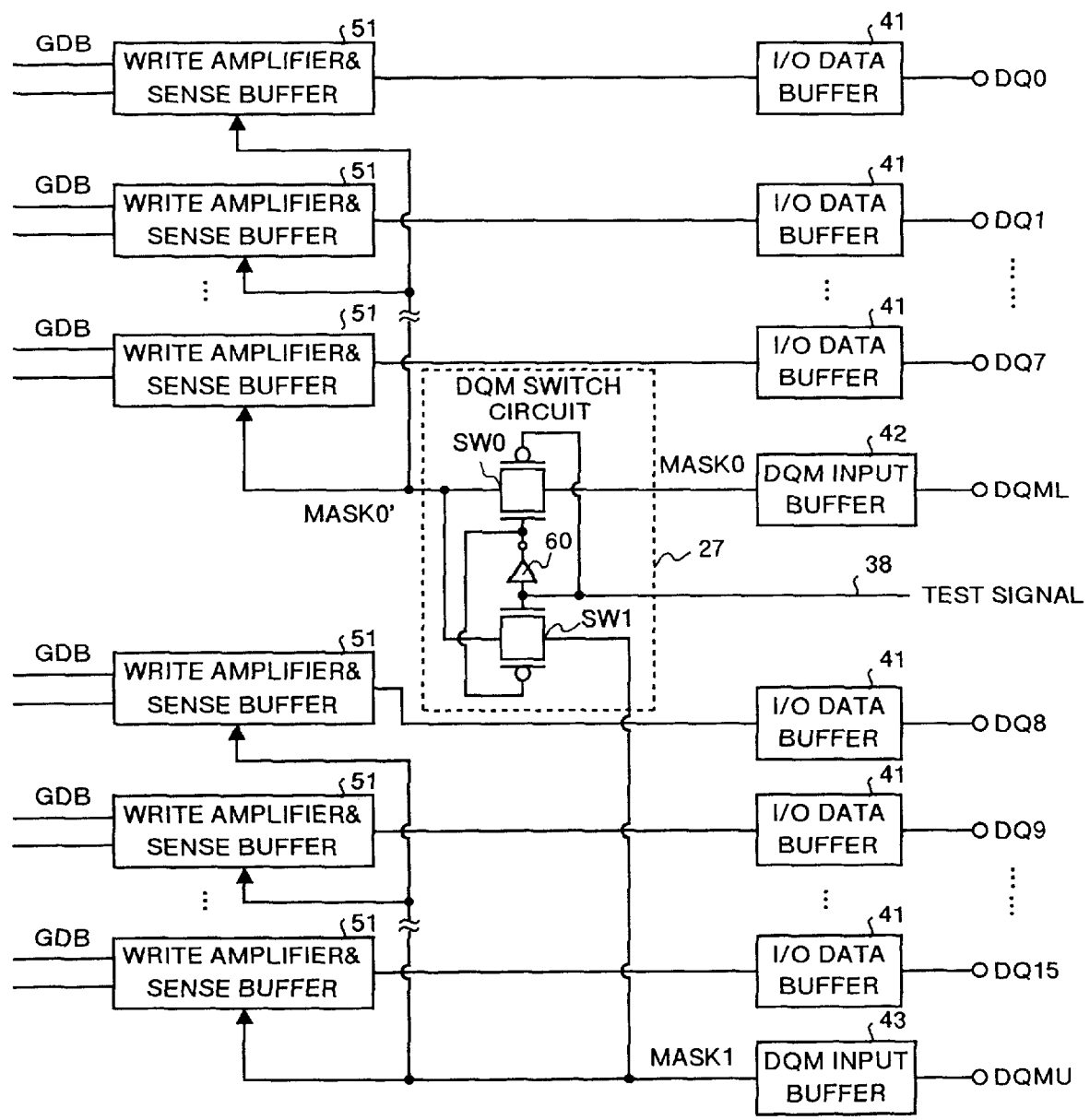
FIG. 4 is a view showing detail configuration of the semiconductor memory according to Embodiment 1.

FIG. 4 is a view showing detail configuration of the I/O data buffer/register 17, DQM switch circuit 27 and write amplifier/sense buffer 15 in the semiconductor memory according to Embodiment 1 of the present invention. FIG. 4 shows configuration comprising a write amplifier & sense buffers 51 and an I/O data buffers 41 corresponding to the write sense amplifier & sense buffers 141 and I/O data buffers 131 shown in FIG. 18 to FIG. 22 respectively. Detail description is made below for operations for data input and output by the SDRAM 10 and operation of the DQM switch circuit 27 with reference to FIG. 4.

The I/O data buffer register 17 shown in FIG. 2 is actually divided, as shown in FIG. 4, into the I/O data buffers 41 connected to the data input/output terminals DQ0 to DQ15, and the DQM input buffer 42 and DQM input buffer 43 connected to the mask/disable terminals DQML and DQMU respectively.

The write amplifier 15 shown in FIG. 2 is actually divided, as shown in FIG. 4, into the write amplifier & sense buffer 51 corresponding to the data input/output terminals DQ0 to DQ15 respectively. The DQM input buffer 42 is connected to the DQM switch circuit 27, and the DQM input buffer 43 is connected to eight write units of write amplifier & sense buffer 51 corresponding to the data input/output terminals DQ8 to DQ15 respectively as well as to the DQM switch circuit 27.

The DQM switch circuit 27 receives a test signal 38 as one of input signals from the test mode decoder 26, and is connected to eight units of write amplifier & sense buffer 51 corresponding to the data input/output terminals DQ0 to DQ7 each as a destination for signal output respectively. Because of this configuration, the DQM switch circuit 27 receives a DQML signal (MASK0) outputted from the DQML input buffer 42, a DQMU signal (MASK1) outputted from the DQM input buffer 43, and a test signal 38 outputted to the test mode decoder 26, and outputs a MASK0' signal to eight units of write amplifier & sense buffer 51 corresponding to the data input/output terminals DQ0 to DQ7.

Herein the DQM switch circuit 27 comprises two transfer gates SW0, SW1 and one inverter 60. One of the contact terminal of the transfer gate SW0 is connected to an input terminal for receiving a MASK0 signal, namely to the DQM input buffer 42, while the other contact terminal is connected to eight units of write amplifier & sense buffer 51 corresponding to output terminals for outputting a MASK0' signal which is a DQML signal corresponding to the DQ0 to DQ7, namely to the data input/output terminals DQ0 to DQ7.

One contact terminal of the transfer gate SW1 is connected to a terminal for receiving the MASK1 signal, namely to the DQM input buffer 43, and the other contact terminal thereof is connected together with the other contact terminal of the transfer gate SW0 to eight write amplifier & sense buffer 51 corresponding to output terminals for outputting the MASK0' signal, namely to the data input/output terminals DQ0 to DQ7.

Further, one control terminal of the transfer gate SW0 is connected to an output terminal of the inverter 60, and the other control terminal thereof is connected to an input terminal of the test signal 38. Also one control terminal of the transfer gate SW1 is connected to an input terminal for receiving a test signal, and the other control terminal thereof is connected to an output terminal of the inverter 60. An input terminal of the inverter 60 is connected to an input terminal for the test signal 38.

Figure 5:
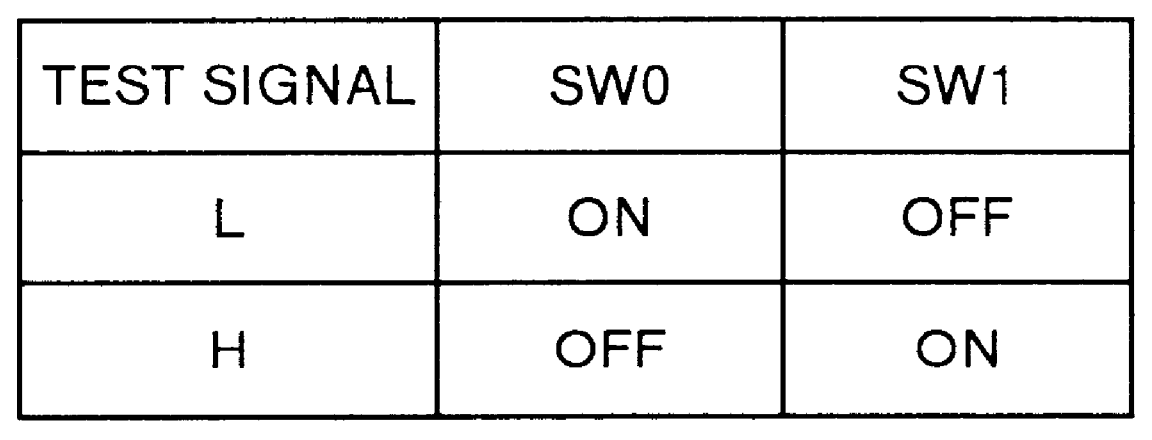

FIG. 5 is an explanatory view showing a relation between a signal level of the test signal 38 and an ON/OFF state of the transfer gates SW0 and SW1. With the configuration as described above, as shown in FIG. 5, when the test signal 38 indicates a "L" level, namely during the normal operations, the transfer gate SW0 is turned ON, and the MASK0 signal outputted from the DQM input buffer 42 is inputted as it is as a DQML signal to the eight units of write amplifier & sense buffer 51 corresponding to the data input/output terminals DQ0 to DQ7. In this step, the transfer gate SW1 is kept OFF, and the MASK1 signal outputted from the DQM input buffer 43 is not outputted from the DQM switch circuit 27.

On the other hand, when the test signal indicates the "H" level, namely in the testing mode, the transfer gate SW0 is turned OFF, and the MASK0 signal outputted from the DQM input buffer 42 is not outputted from the DQM switch circuit 27. In this case, the transfer gate SW1 is kept ON, and the MASK1 signal outputted from the DQM input buffer 43 is inputted as it is as a DQML signal to the eight units of write amplifier & sense buffer 51 corresponding to the data input/output terminals DQ0 to DQ7.

When the test signal 38 indicates a "L" level, namely in the ordinary data write/read operation, and to described more precisely, when a data write instruction is given to the write amplifier & sense buffer 51, the data inputted to each of the data input/output terminals DQ0 to DQ15 is inputted via the respective I/O data buffer 41 to the write amplifier & sense buffer 51 and then sent to the GDB.

In this step, when a mask/disable signal inputted from the DQML terminal indicates a "H" level, namely when a DQML signal outputted from the DQM switch circuit 27 indicates a "H" level, data write is inhibited, and the data is not sent from the write amplifier & sense buffers 51 corresponding to the data input/output terminals DQ0 to DQ7 to the GDB. Likely when the mask/disable signal inputted from the DQMU terminal indicates a "H" level, the data is not sent from the write amplifier & sense buffer 51 corresponding to the data input/output terminals DQ8 to DQ51 to the GDB.

When the test signal 38 indicates a "L" level, namely in the ordinary data write/read operation, if a data read instruction is given to a bank, more specifically to the write amplifier & sense buffer 51, data in memory cells each successively identified according to a row address signal and a column address signal is sent via the sense amplifier to the GDB 16, and is inputted to the write amplifier & sense buffers 51 each connected to the GDB 16. Data inputted to each of the write amplifier & sense buffers 51 is sent to the respective I/O data buffer 41, and is outputted from the data input/output terminals DQ0 to DQ15.

In this step, when a mask/disable signal inputted from the DQML terminal indicates a "H" level, namely when a DQML signal outputted from the DQM switch circuit 27 indicates a "H" level, data read is inhibited, and the data is not sent to the write amplifier & sense buffers 51 corresponding to the data input/output terminals DQ0 to DQ7. Likely when a mask/disable signal inputted from the DQMU terminal indicates a "H" level, the data is not sent from the write amplifier & sense buffers 51 corresponding to the input terminals DQ8 to DQ15 to the I/O data buffer 41.

On the other hand, when the test signal 38 indicates a "H" level, a DQMU signal sent from the DQM input buffer 43 is inputted to all of the write amplifier & sense buffers 51 corresponding to the data input/output terminals DQ0 to DQ15, so that the mask/disable control for all of the data input/output terminals can be executed according to only this DQMU signal. Namely, in the testing mode, it is not necessary to transmit a control signal from the IC tester to a DQML terminal of each semiconductor memory device. On the other hand, when the test signal 38 indicates a "L" level, namely in the ordinary operation mode, mask/disable control for each data input/output terminal can be executed according to a signal level of a DQML signal as well as of a DQMU signal. With this configuration, a number of comparators/drivers allocated for the mask/disable operation is reduced to half of those required in the conventional technology when semiconductor memory devices are tested with the IC tester.

Description of Embodiment 1 above assumed a case where, in each of the write amplifier & sense buffers 51, a disable operation for data read is executed by the sense buffer and a mask operation for data write is executed by the write amplifier, but a configuration is allowable in which the disable operation for data read is executed by the I/O data buffer and the mask operation for data write is executed by the write amplifier. Namely the write amplifier & sense buffer 51 and I/O data buffer 41 shown in FIG. 4 may be exchanged with a sense buffer 151*a* and an I/O data buffer 131*a* each shown in FIG. 23 respectively.

Figure 6:
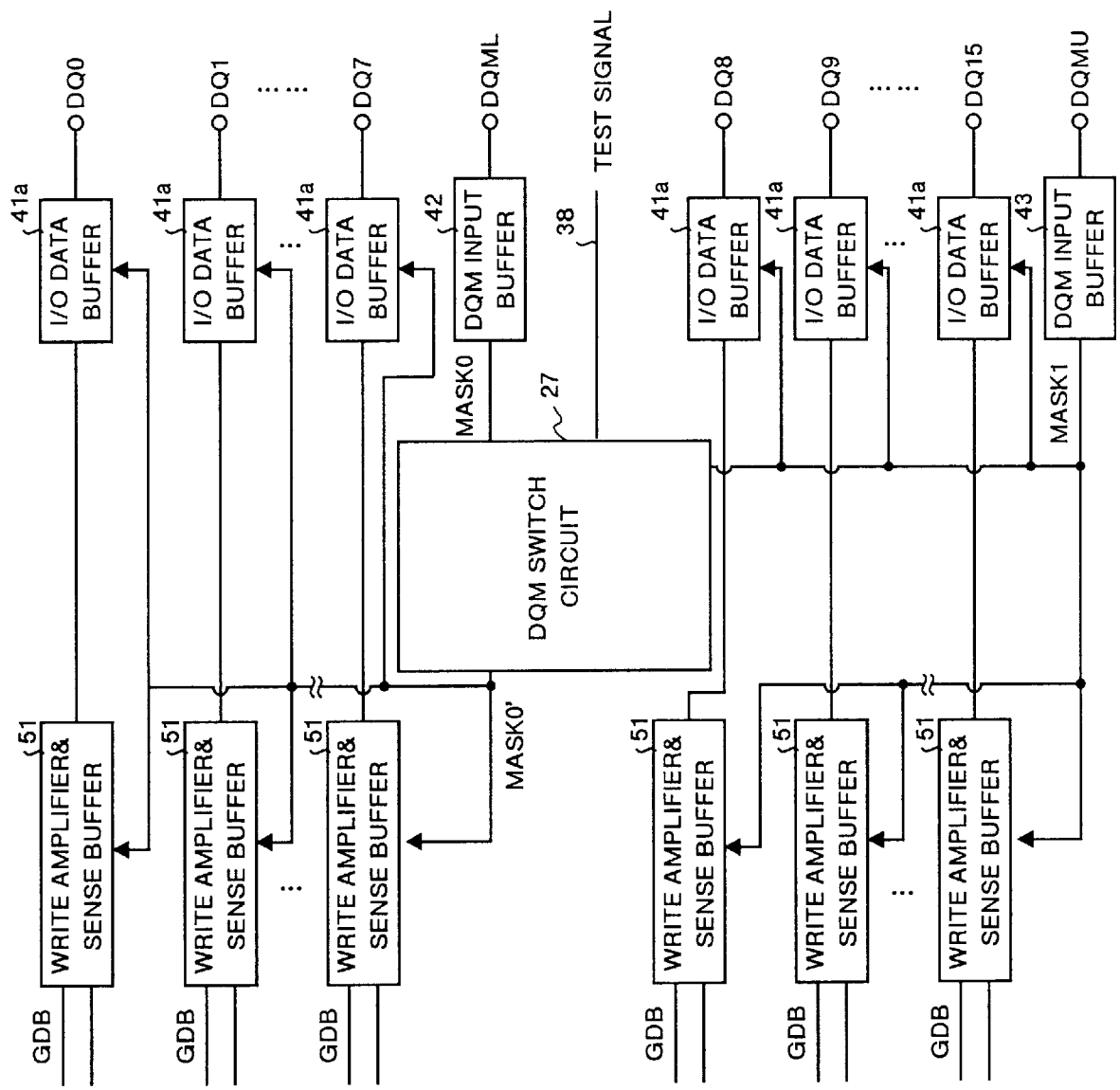
FIG. 6 is a view showing detail configuration of the semiconductor memory according to Embodiment 1 in which an I/O data buffer enabling a disable operation is employed.

FIG. 6 is a view showing detail configuration of connection among the I/O data buffer 41*a*, the write amplifier & sense buffer 15 with a mask/disable signal supplied only to the write amplifier therein, and the DQM switch circuit 27. FIG. 6 is different from FIG. 4 in that the MASK0' signal outputted from the DQM switch circuit 27 is supplied not only to the write amplifier & sense buffer 51 corresponding to the data input/output terminals DQ0 to DQ7, but also to the I/O data buffers 41*a* corresponding to the data input/output terminals DQ0 to DQ7, and that the MASK1 signal outputted from the DQM input buffer is supplied not only to the write amplifier & sense buffers 51 corresponding to the data input/output terminals DQ8 to DQ15, but also to the I/O data buffers 41*a* corresponding to the data input/output terminals DQ8 to DQ15.

With this configuration, a mask operation for write data can be executed by the write amplifier & sense buffer 51 (especially by the write amplifier), and a disable operation for read data can be executed by the I/O data buffer 41*a*.

The semiconductor memory having a plurality of mask/disable terminals for executing a data mask/disable operation according to Embodiment 1 of the present invention described above has a test mode decoder for determining a testing mode for testing with a IC tester or the like according to a combination of a plurality of input signals each constituting a control instruction such as data write/read and outputting a test signal indicating the testing mode, and a DQM switch circuit for enabling a mask/disable operation for all data by using only one mask/disable terminal of the plurality of mask/disable terminals, so that it is possible to reduce a number of comparators/drivers used for testing a mask/disable operation in the IC tester and also to increase a number of semiconductor memories which can simultaneously be tested with one IC tester. With this feature, the semiconductor memory according to this memory can substantially reduce the time and cost required for testing.

Figure 7:
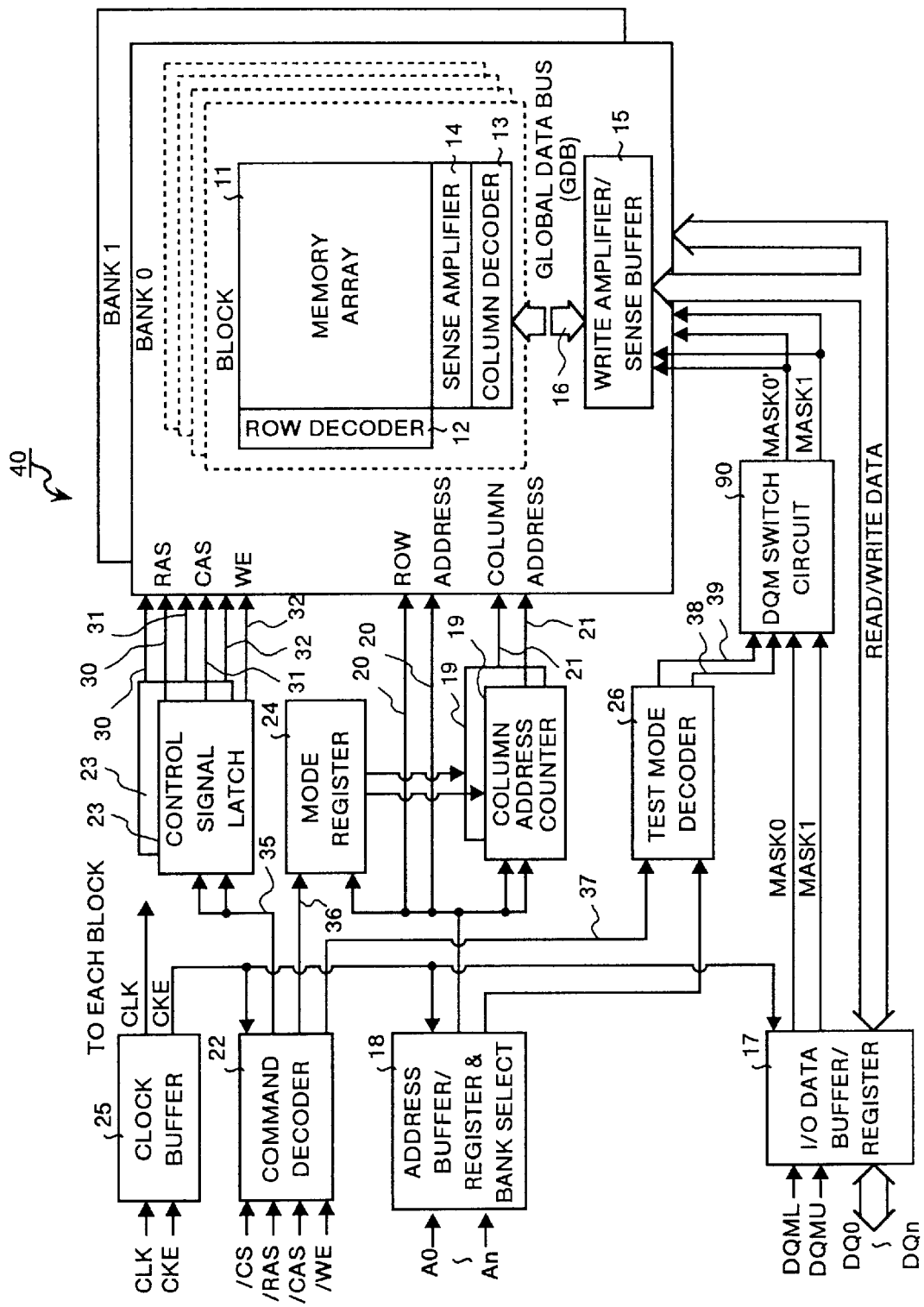
FIG. 7 is a block diagram showing general configuration of a semiconductor memory according to Embodiment 2 of the present invention.

Next, description is made for a semiconductor memory according to Embodiment 2 of the present invention. Embodiment 2 is different from Embodiment 1 in that the test signal 38 and test instruction signal 39 are supplied from the test mode decoder 26 to a DQM switch circuit 90, and that configuration of the DQM switch circuit 90 has been modified according to the change above. FIG. 7 is a block diagram showing general configuration of the semiconductor memory according to Embodiment 2. In the SDRAM 40 shown in FIG. 7, which is a semiconductor memory according to Embodiment 2, the test mode decoder 26 generates a test signal 38 and a test instruction signal (TCS signal) 39 according to a test instruction signal (TCS signal) inputted from the command decoder 22 as well as according to a portion of address signals outputted from the address buffer/register & bank select 18, while the DQM switch circuit 90 receives the test signal 38 and test instruction signal 39.

Figure 8:
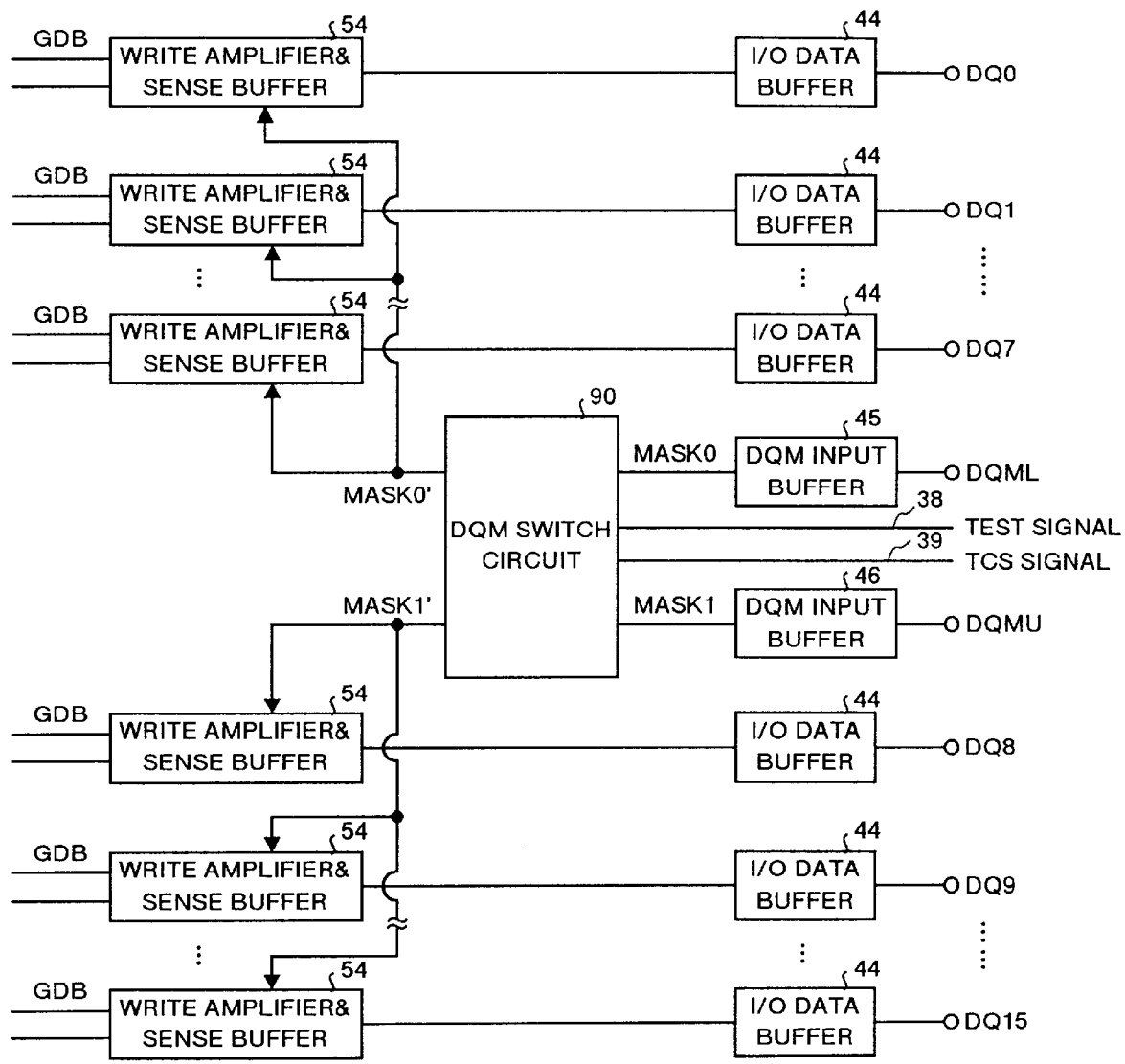
FIG. 8 is an explanatory view showing configuration of the key sections of the semiconductor memory according to Embodiment 2.

FIG. 8 is an explanatory view showing key sections of the semiconductor memory according to the present invention, more specifically configuration of a data input/output section and a SQM switch circuit 90 in the SDRAM 40. FIG. 8 shows configuration comprising write amplifier & sense buffers 54 and an I/O data buffers 44 corresponding to the write amplifier & sense buffers 141 and I/O data buffers 131 shown in FIG. 18 to FIG. 22. In FIG. 8, data signals inputted to the data input/output terminals DQ0 to DQ15 are inputted to the I/O data buffers 44 corresponding to the data input/output terminals respectively, and a DQML signal and DQMU signal inputted to the DQML terminal and a DQMU terminal respectively are inputted to a DQM input buffer 45 and a DQM input buffer 46 corresponding to the DQML terminal and DQMU terminal respectively.

The DQM switch circuit 90 further receives the test signal 38 and TCS signal 39 each as an input signal from the test mode decoder 26. The DQM switch circuit 90 outputs a MASK0' signal and a MASK1' signal each as a mask/disable signal to the write amplifier & sense buffer 54 in response to the MASK0 signal, MASK1 signal, test signal 38 and TCS signal 39.

The MASL0' signal outputted from the DQM switch circuit 90 is inputted to eight units of write amplifier & sense buffer 54 corresponding to the data input/output terminals DQ0 to DQ7 respectively. A mask/disable operation can be executed for data inputted to or outputted from the data input/output terminals DQ0 to DQ7 according to a signal level of this MASK0' signal. The MASK1' signal outputted from the DQM switch circuit 90 is inputted to eight units of write amplifier & sense buffer 54 corresponding to the data input/output terminals DQ8 to DQ15 respectively. A mask/disable operation for data inputted to or outputted from the data input terminals DQ8 to DQ15 can be executed according to a signal level of this MASK1' signal.

Figure 9:
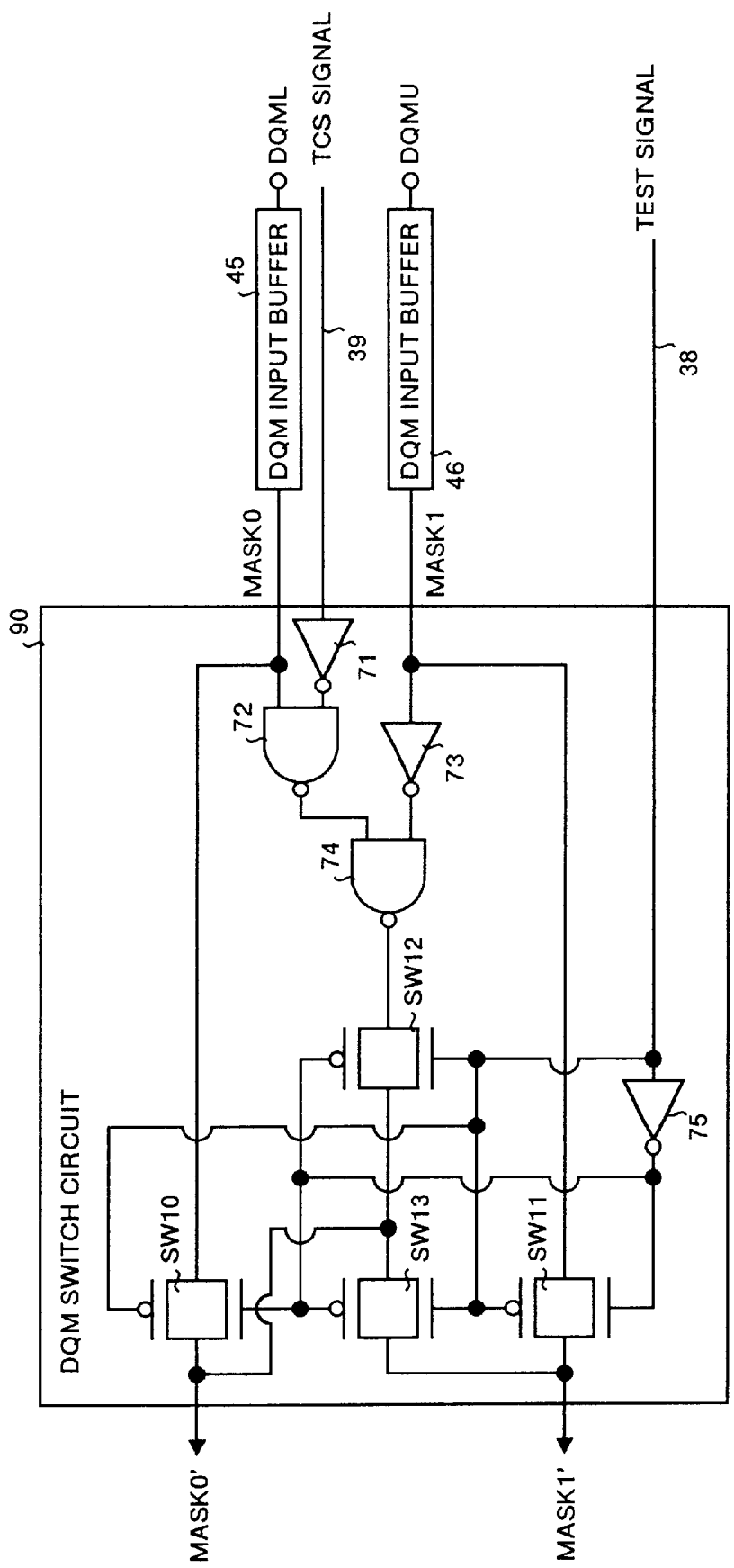
FIG. 9 is an explanatory view showing circuit configuration of a DQM switching circuit in the semiconductor memory according to Embodiment 2.

FIG. 9 is an explanatory view showing circuit configuration of the DQM switch circuit 90. In FIG. 9, the DQM switch circuit 90 comprises four transfer gates SW10 to SW13, three inverters 71, 73, 75, and two NAND gates 72, 74.

The inverter 75 has the input terminal connected to an input terminal for the test signal 38, and outputs an inverted signal thereof. One contact terminal of the transfer gate SW10 is connected to an input terminal for receiving the MASK0 signal, namely to the DQM input buffer 45, and the other contact terminal is connected to an output terminal for outputting the MASK0' signal, namely to eight write amplifier & sense buffers 54 corresponding to the data input terminals DQ0 to DQ7.

One contact terminal of the transfer gate SW11 is connected to an input terminal for receiving the MASK1 signal, namely to the DQM input buffer 46, and the other contact terminal is connected to an output terminal for outputting the MASK1' signal, namely to eight write amplifier & sense buffers 54 corresponding to the data input terminals DQ8 to DQ15.

Further, one control terminal of the transfer gate SW10 is connected to an output of the inverter 75, and the other control terminal is connected to an input terminal for the test signal 38. Also one control terminal of the transfer gate SW11 is similarly connected to an output terminal of the inverter 75, and the other control terminal is connected to an input terminal for the test signal 38.

FIG. 10 an explanatory view showing a relation between a signal level of the test signal 38 and an ON/OFF state of the transfer gates SW10 to SW13. As shown in FIG. 10, when the test signal 38 indicates a "L" level (namely in the ordinary operation mode), the transfer gate SW10 and transfer gate SW11 are turned ON, the transfer gate SW10 outputs the MASK0 signal as it is as the MASK0' signal.

On the other hand, when the test signal 38 indicates "H" level (namely in the testing mode), the transfer gate SW10 and transfer gate SW11 are turned OFF, and the transfer gate SW10 does not output the MASK0 signal as the MASK0' signal. Also the transfer gate SW11 does not output the MASK1 signal as the MASK1' signal.

One contact terminal of the transfer gate SW12 is connected to an output terminal of the NAND gate 74, and the other contact terminal is connected to one contact terminal of the transfer gate SW13 as well as to an output terminal for outputting the MASK0' signal. One contact terminal of the transfer gate SW13 is connected to the other contact terminal of the transfer gate SW12, and the other contact terminal is connected to an output terminal for outputting the MASK1' signal.

Further, one control terminal of the transfer gate SW12 is connected to an input terminal for the test signal 38, and the other control terminal is connected to an output terminal of the inverter 75. Also one control terminal of the transfer gate SW13 is connected to an output terminal of the inverter 75, and the other control terminal is connected to an input terminal for the test signal 38.

Because of this configuration, as shown in FIG. 10, when the test signal 38 indicates a "L" level (in the ordinary operation mode), the transfer gate SW12 is turned OFF, and a signal from the NAND gate 74 is not outputted as the MASK0' signal, nor as the MASK1' signal.

On the other hand, when the test signal 38 indicates a "H" level (in the testing mode), both the transfer gate SW12 and transfer gate SW13 are turned ON, and the transfer gate SW12 outputs a signal inputted from the NAND gate 74 as the MASK0' signal, while the transfer gate SW13 outputs a signal outputted from the NAND gate 74 as the MASK1' signal. At this point of time, the TCS signal 39 indicates a "H" level, and because of this configuration, output from the NAND gate 72 is fixed at a "H" level, and the NAND gate 74 functions as an inverter to an output signal from the inverter 73. Thus, the MASK0' signal and MASK1' signal indicates the same logical level as that of the MASK1 signal which is an output signal from the DQM input buffer 46. With this configuration, in operation of the transfer gates SW10 to SW13 described above, when the test signal 38 indicates a "L" level (in the ordinary operation mode), the transfer gates SW10 and SW11 are turned ON, while the transfer gate SW12 and SW13 are turned OFF, so that the MASK0 signal inputted to a DQM switch circuit is outputted as it is as the MASK0' signal, and the MASK1 signal is outputted as it is as the MASK1' signal.

When the test signal 38 indicates a "H" level (in the testing mode), the transfer gates SW10 and SW11 are turned OFF, while the transfer gates SW12 and SW13 are turned ON, so that signals outputted as MASK0' and MASK1' signal change according to a level of a signal outputted from the NAND gate 74.

Then description is made for operations of the NAND gate 72 and inverters 71 and 73 which decide the level of an output signal from the NAND gate 74. One input terminal of the NAND gate 74 is connected to an output terminal of the NAND gate 72, and the other input terminal is connected to an output terminal of the inverter 73. One input terminal of the NAND gate 72 is connected to an input terminal for receiving the MASK0 signal, and the other input terminal is connected to an output terminal of the inverter 71. The inverter 71 receives the TCS signal 39 outputted from the test mode decoder described above, and outputs an inverted signal thereof. The inverter 73 receives the MASK0 signal, and outputs an inverted signal thereof.

When the TCS signal 39 indicates a "H" level, or when the semiconductor memory is operated in the testing mode, output from the inverter 71 indicates a "L" level, and output from the NAND gate 72 indicates a "H" level regardless of a level of the MASK0 signal. In this state, when the MASK1 signal indicates a "H" level, output from the inverter 73 indicates a "L" level, so that output from the NAND gate 74 indicates a "H" level.

In the state wherein the TCS signal 39 indicates a "H" level, when the MASK1 signal indicates a "L" level, output from the inverter 73 indicates a "H" level, so that output from the NAND gate 74 indicates a "L" level. Namely, when the TCS signal 39 indicates a "H" level, the MASK1 signal is outputted as it is from the NAND gate 74.

In Embodiment 2, when the test signal 38 indicates a "H" level, namely when the semiconductor memory is operated in the testing mode, a DQMU terminal for receiving the MASK1 signal via the DQM input buffer 46 can be used as a terminal allocated to a comparator/driver of an IC tester, and it is possible to reduce a number of comparator/drivers allocated for testing with an IC tester without using the DQML terminal by giving a mask/disable signal only to the DQMU terminal.

Figure 23:
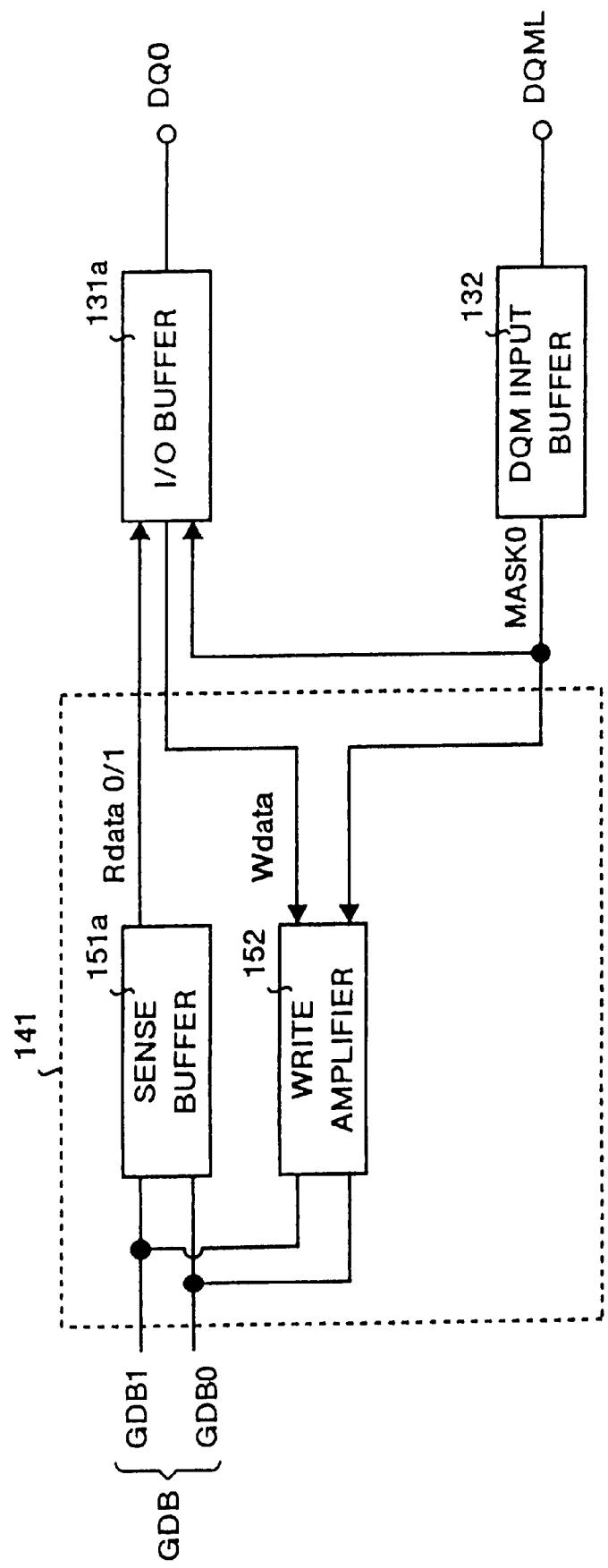
FIG. 23 is an explanatory view showing connection among key sections of the semiconductor memory based on the conventional technology.
Figure 24:
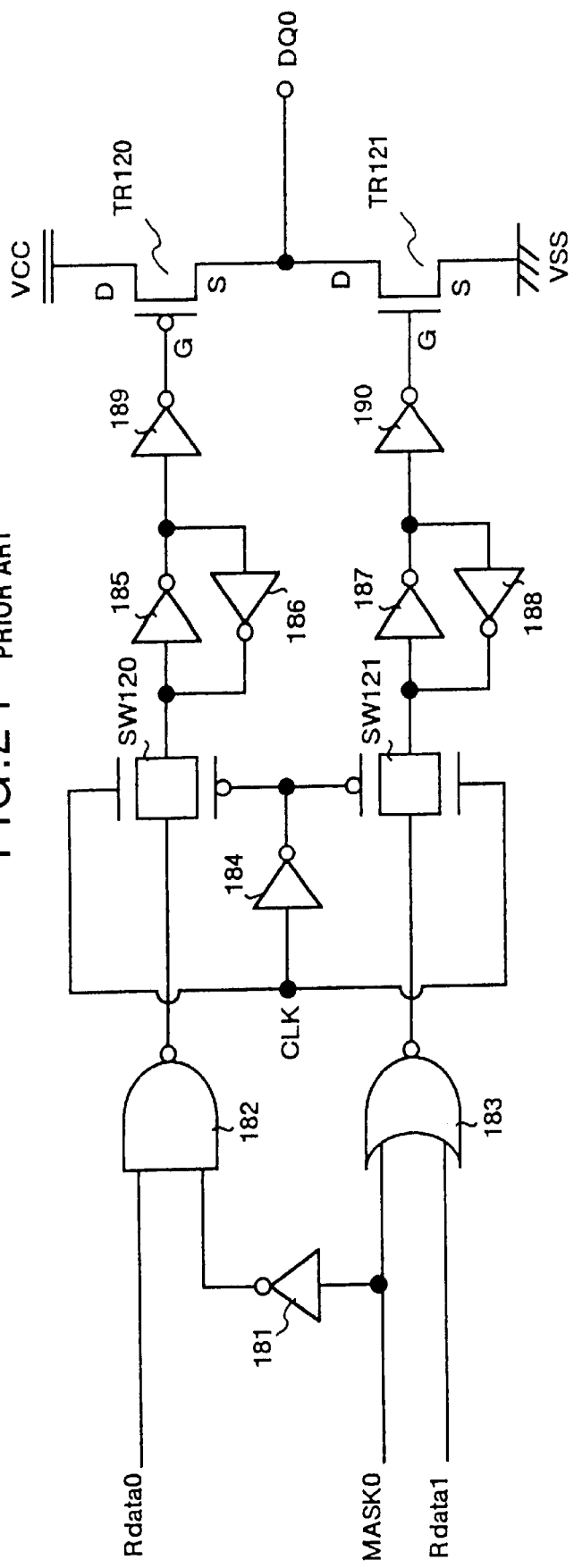
FIG. 24 is an explanatory view showing circuit configuration of an I/O data buffer in the semiconductor memory based on the conventional technology.
Figure 25:
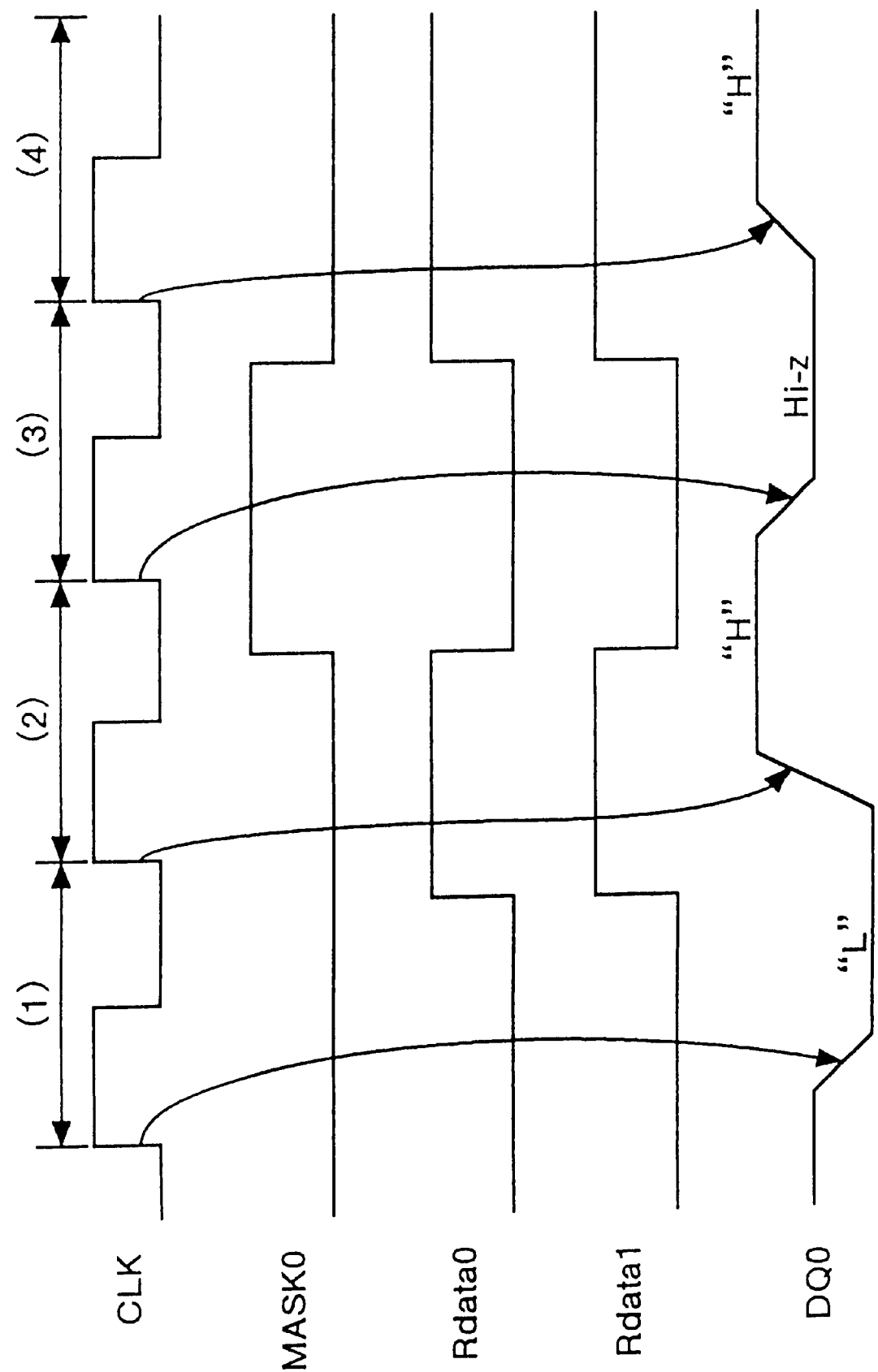
FIG. 25 is a time chart for signals inputted to or outputted from an I/O data buffer in the semiconductor memory based on the conventional technology.

In Embodiment 2 described above, in the write amplifier & sense buffer 54, an operation for disabling data read is executed by a sense buffer, and an operation for masking against data write is executed by the write amplifier, but as shown in FIG. 23 to FIG. 25, a configuration is allowable in which an operation for disabling data read is executed by an I/O data buffer and an operation for masking against data write is executed by a write amplifier. Namely, the sense buffer in the write amplifier & sense buffer 54 shown in FIG. 8 and I/O data buffer 44 may be exchanged with the sense buffer 151a and I/O data buffer 131a shown in FIG. 23 respectively.

Figure 11:
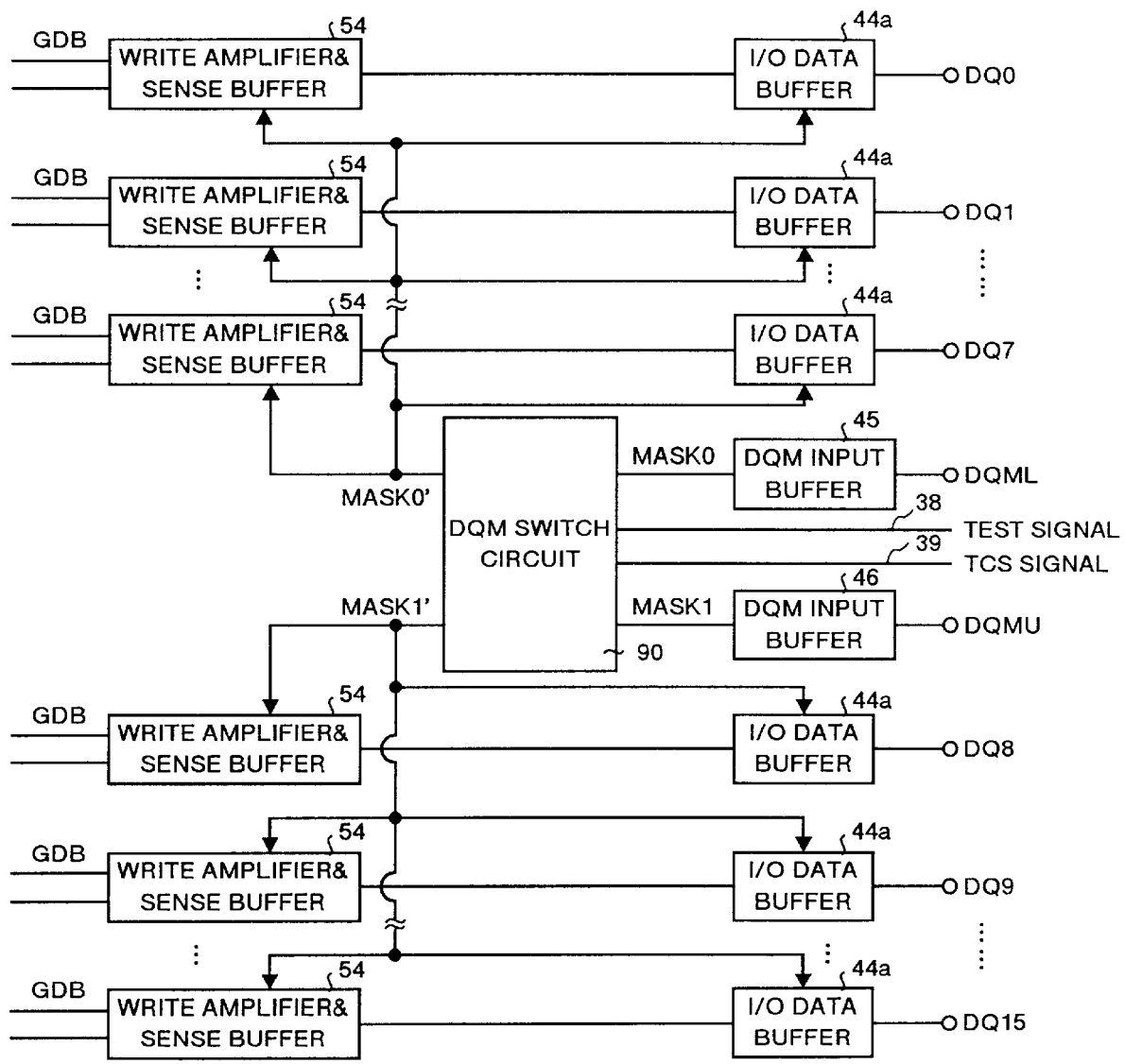
FIG. 11 is a view showing detail configuration of the semiconductor memory according to Embodiment 2 in which an I/O data buffer enabling a disable operation is employed.

FIG. 11 is a view showing detail configuration of connection among an I/O data buffer 44a enabling a disable operation in an I/O data buffer, a write amplifier & sense buffer 54 with a mask/disable signal supplied thereto, and DQM switch circuit 90. FIG. 11 is different from FIG. 8 in that the MASK0 signal outputted from the DQM switch circuit 90 is supplied not only to the write amplifier & sense buffer 54 corresponding to the data input/output terminals DQ0 to DQ7, but also to the I/O data buffer 44a corresponding to the data input/output terminals DQ0 to DQ7, and that the MAKS1' signal outputted from the DQM switch circuit 90 is supplied not only to the write amplifier & sense buffer 54 corresponding to the data input/output terminals DQ8 to DQ15, but also to the I/O data buffer 44a corresponding to the data input/output terminals DQ8 to DQ15.

With this configuration, an operation for masking against write data can be executed by the write amplifier & sense buffer 54 (especially the write amplifier) and an operation for disabling read data can be executed by the I/O data buffer 44a.

The semiconductor memory according to Embodiment 2 having a plurality of mask/disable terminals each for executing a mask/disable data for data comprises a test mode decoder for determining a testing mode for testing with an IC tester or the like according to a combination of a plurality of input signals each constituting a control instruction such as data write/read or others and outputting a test signal indicating the test mode, and a test instruction signal, a DQM switch circuit for enabling a mask/disable operation for data, when the test signal and test instruction signal are active, by using one of the plurality of mask/disable terminals, so that it is possible to reduce a number of comparators/drivers used for testing a mask/disable operation with an IC tester and to increase a number of semiconductor units which can be tested simultaneously. Therefore, with the semiconductor memory according to the present invention, it is possible to substantially reduce a time and cost required for testing.

In addition, the DQM switch circuit comprises a logical gate and a transfer gate, so that the DQM switch circuit can be integrated as a component into a semiconductor memory without the necessity of enlarging size of a semiconductor memory, and a high speed operation can be realized.

Figure 12:
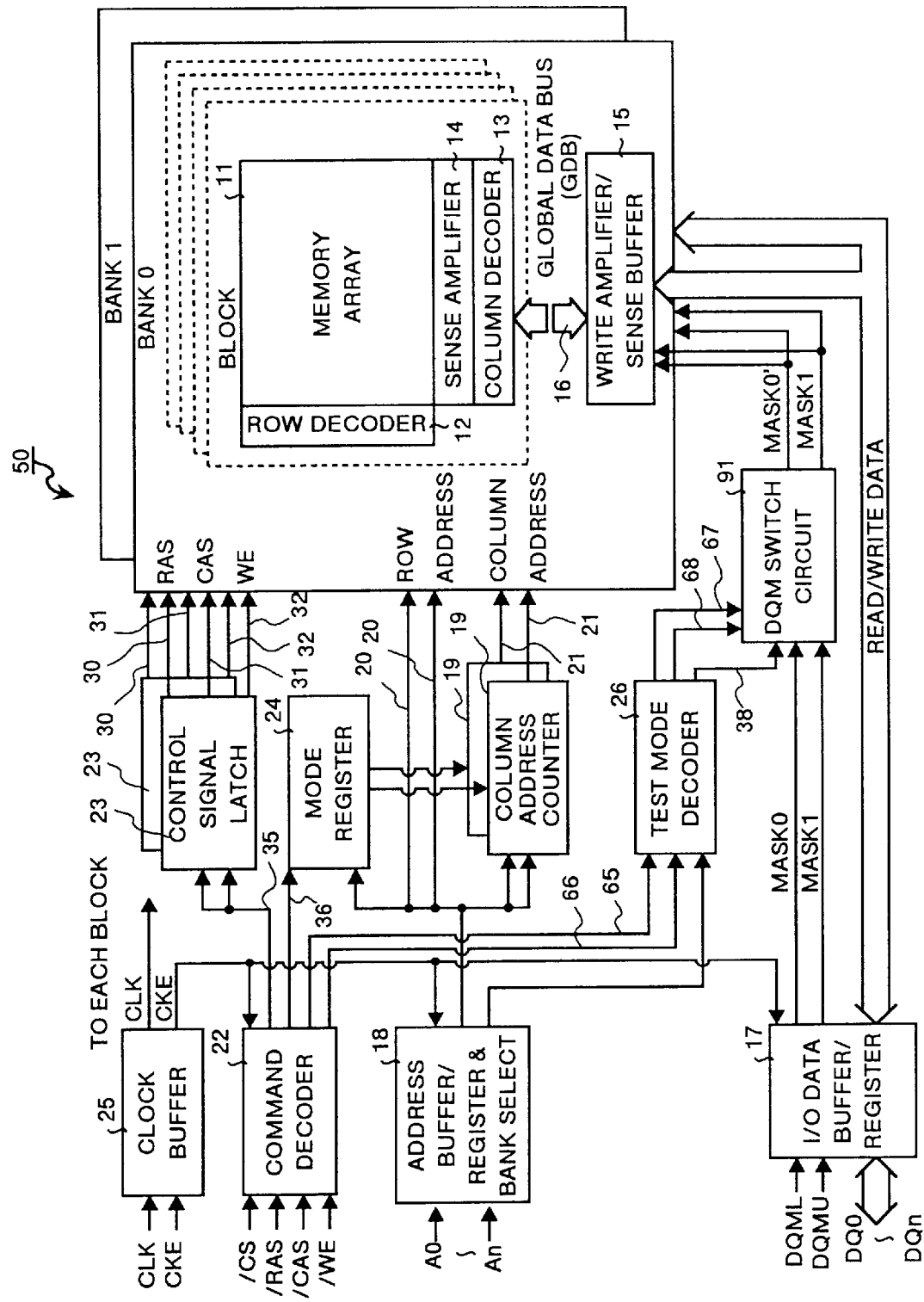
FIG. 12 is a block diagram showing general configuration of a semiconductor memory according to Embodiment 3.

Next, description is made for a semiconductor memory according to Embodiment 3 of the present invention. Embodiment 3 is different from Embodiment 2 described above in that the test signal 38 and two test instruction signals 67, 68 are supplied from the test mode decoder 26 to a DQM switch circuit, and that, when the test instruction signal 67 indicates "H" level, the DQML signal is supplied as the MASK0' signal or MASK1' signal, and when the test instruction signal 68 indicates a "H" level, the DQML signal is supplied as the MASK0' signal or MASK1' signal, namely that a mask/disable terminal (DQML or DQMU) to be used in testing can be selected according to the test instruction signals 67, 68. FIG. 12 is a block diagram showing general configuration of the semiconductor memory according to Embodiment 3. In the SDRAM 50 shown in shown in FIG. 12, which is the semiconductor memory according to Embodiment 3, the two test instruction signals (TCS1 signal, TCS2 signal) are outputted, and the test decoder 26 receives the TCS1 signal 65 and TCS2 signal 66 as well as a portion of addresses of the address buffer/register & bank select 18, and outputs the test signal 38 as well as the TCS1 signal and TCS2 signal (described as TCS1 signal 67 and TCS signal 68 hereinafter), and these three signals are inputted to a DQM switch circuit 91. It should be noted that, when either one of the TSC1 signal 65 and TCS2 signal 66 indicates a "H" level, the test signal 38 indicates a "H" level and is outputted from the test mode decoder 26. Which one of the TCS1 signal 67 and TCS2 signal 68 should be set in a "H" level may be switched according to an address signal inputted into the test mode decoder 26 in place of outputting the TCS1 signal 65 and TCS2 signal from the command decoder 22.

Figure 13:
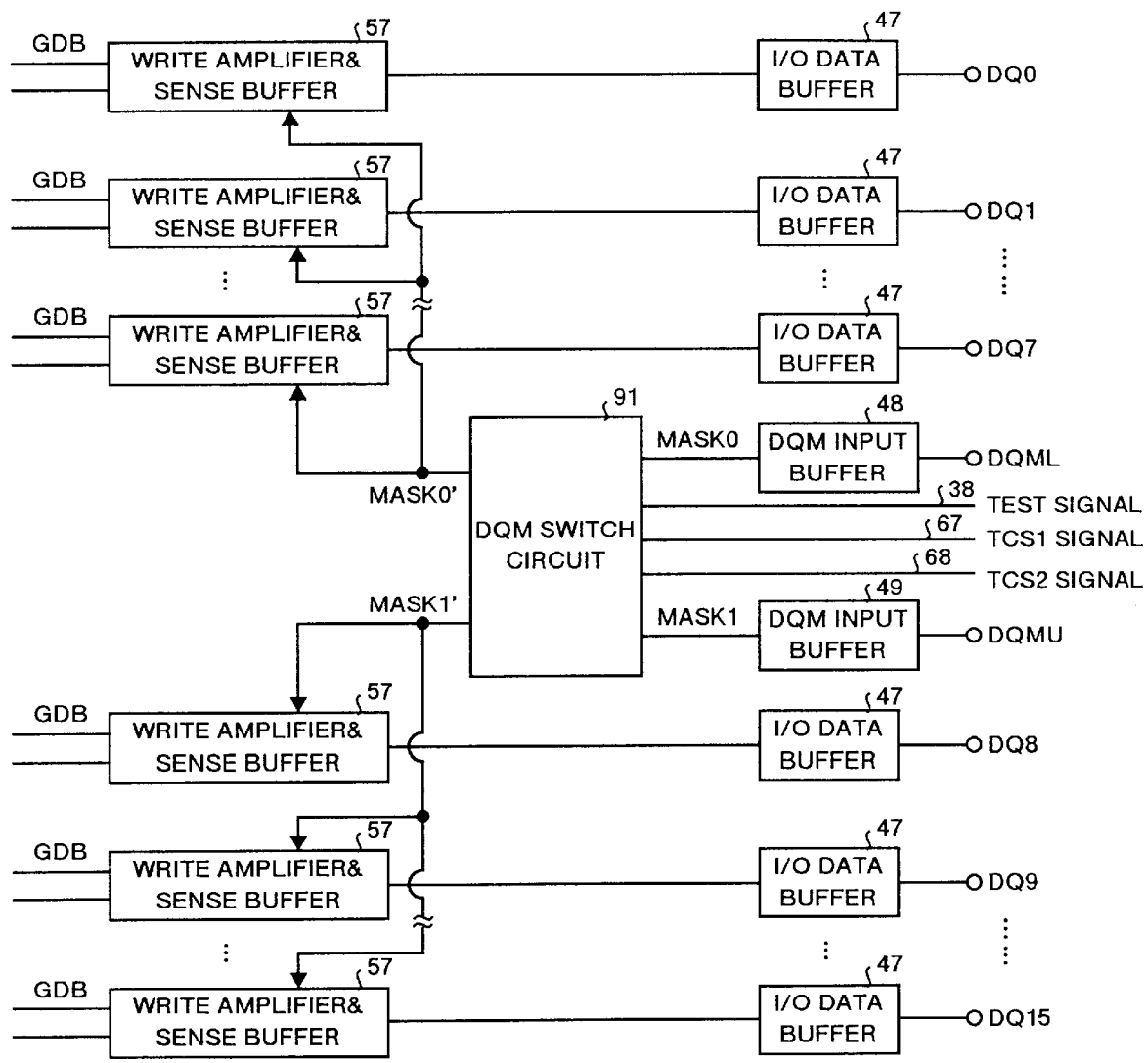
FIG. 13 is an explanatory view showing configuration of the key sections of the semiconductor memory according to Embodiment 3.

FIG. 13 is an explanatory view showing configuration of the key sections of the semiconductor memory according to Embodiment 3, and shows detail configuration of a data input/output section and the DQM switch circuit 91 in the SDRAM 50. FIG. 13 especially shows write amplifier & sense buffers 57 and I/O data buffers 47 corresponding to the write amplifier & sense buffers 141 and I/O data buffers 131 shown in FIG. 18 to FIG. 22 respectively. In FIG. 13, each data signal inputted to each of the data input/output terminals DQ0 to DQ15 is inputted to the I/O data buffer 47 in each respective data input/output terminal, while the DQML signal and DQMU signal inputted to the DQML terminal and DQMU terminal respectively are inputted to the DQML buffer 48 and DQM input buffer 49 corresponding to the DQML terminal and DQMU terminal respectively.

The DQM input buffer 48 outputs the MASK0 signal as a mask/disable signal, and the MASK0 signal is inputted to the DQM switch circuit 91. The DQM input buffer 49 outputs the MASK1 signal as a mask/disable signal, and also the MASK1 signal is inputted to the DQM switch circuit 91.

The DQM switch circuit 91 receives the test signal 38, TCS1 signal 67 and TCS2 signal 68 as input signals from the test mode decoder 26. The DQM switch circuit 91 outputs MASK0' and MASK1' signal each as a mask/disable signal to the write amplifier & sense buffer 57 in response to the MASK0 signal, MASK1 signal, test signal 38, TCS1 signal 67 and TCS2 signal 68.

The MASK0' signal outputted from the DQM switch circuit 91 is inputted to eight units of write amplifier & sense buffers 57 corresponding to the data input/output terminals DQ0 to DQ7. A mask/disable operation for data inputted to or outputted from the data input/output terminals DQ0 to DQ7 can be executed according to a signal level of the MASK0' signal.

The MASK1' signal outputted from the DQM switch circuit 91 is inputted to eight units of write amplifier & sense buffers 57 corresponding to the data input/output terminals DQ8 to DQ15 respectively. A mask/disable operation for data inputted to or outputted from the data input/output terminals DQ8 to DQ15 can be executed according to a signal level of this MASK1' signal.

Figure 14:
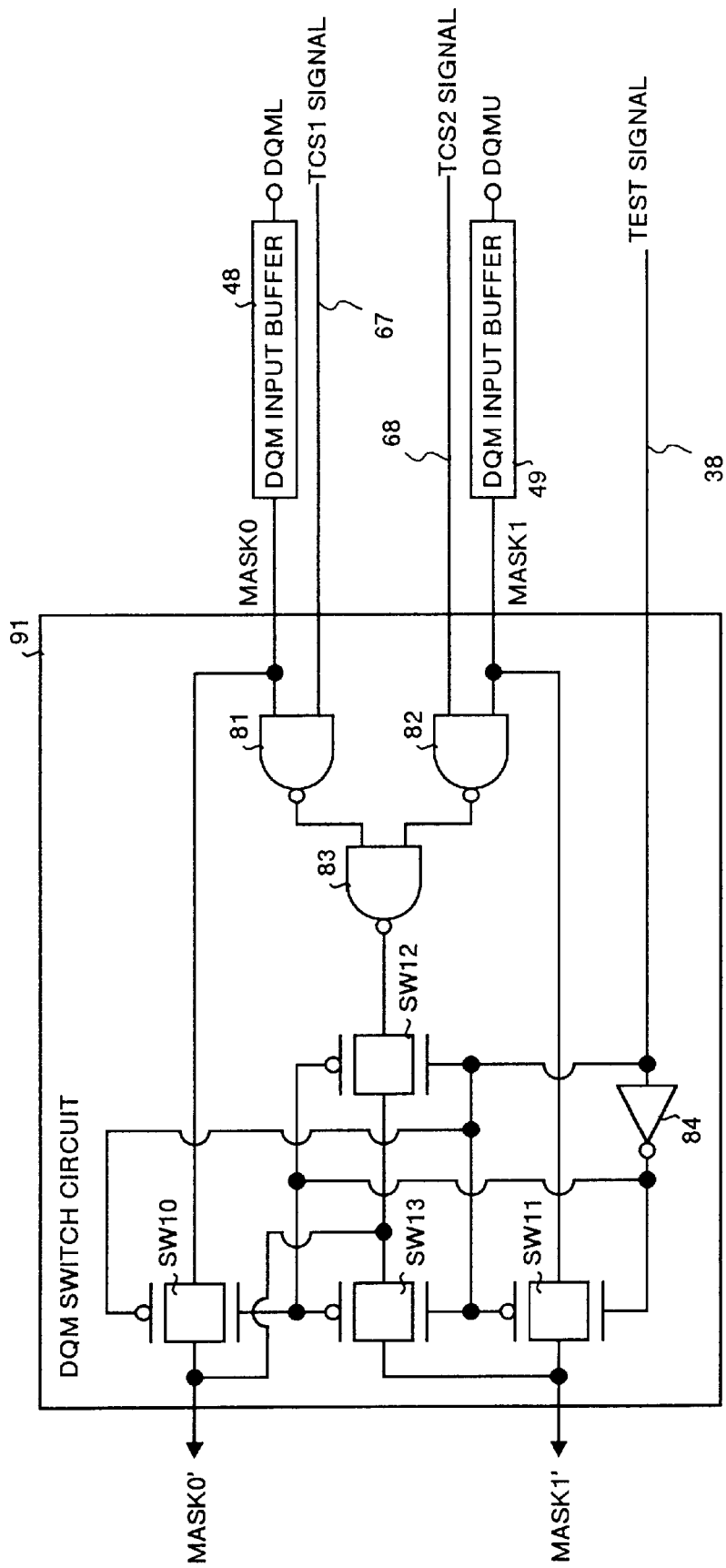
FIG. 14 is an explanatory view showing circuit configuration of a DQM switching circuit in the semiconductor memory according to Embodiment 3.

FIG. 14 is an explanatory view showing circuit configuration of the DQM switch circuit 91. In FIG. 14, the DQM switch circuit 91 comprises four transfer gates SW10 to SW13, three NAND gates 81, 82, 83, and one inverter 84.

The inverter 84 has the input terminal connected to an input terminal for the test signal 38, and outputs an inverted signal thereof. Configuration and operations of the transfer gates SW10 to SW13 are the same as those shown in FIG. 9, so that description thereof is omitted herein.

Because of this configuration, a relation between the transfer gates SW10 to SW13 shown in FIG. 14 and the test signal 38 is the same as that shown in FIG. 10. Thus, in operation of the transfer gates SW10 to SW13, when the test signal 38 indicates a "L" level (in the ordinary operation mode), the transfer gates SW10 and SW11 are turned ON with the transfer gates SW12 and SW13 turned OFF, so that the MASK0 signal inputted to the DQM switch circuit 91 is outputted as it is as the MASK0' signal, while the MASK1 signal is outputted as it is as the MASK1' signal.

When the test signal 38 indicates a "H" level (in the testing mode), the transfer gates SW10 and SW11 are turned OFF with the transfer gates SW12 and SW13 turned OFF, so that both of signals outputted as the MASK0' signal and MASK1' signal change according to a level of a signal outputted from the NAND gate 83.

Next, description is made for operations of the NAND gates 81 and 82 which decide the level of an output signal from the NAND gate 83. One input terminal of the NAND gate 83 is connected to an output terminal of the NAND gate 81, and the other input terminal thereof is connected to an output terminal of the NAND gate 82. Further, one input terminal of the NAND gate 81 is connected to an output terminal of the DQQM buffer 48 outputting the MASK0 signal, and the other input terminal thereof is connected to an input terminal for receiving the TCS1 signal 67 outputted from the test mode decoder described above. One input terminal of the NAND gate 82 is connected to an output terminal of the DQM input buffer 49 for outputting the MASK1 signal, and the other input terminal thereof is connected to an input terminal for receiving the TCS2 signal 68 outputted from the test mode decoder described above.

When the TCS1 signal 67 indicates a "L" level, output from the NAND gate 81 indicates a "H" level irrespective of a level of the MASK0 signal. In this state, so far as the TCS2 signal 68 indicates a "H" level, an inverted signal of the MASK1 signal is outputted from the NAND gate 82. As output from the NAND gate 81 indicates a "H" level, output from the NAND gate 82 is again inverted in the NAND gate 83. Namely, when the test signal 38 indicates a "H" level and at the same time the TCS1 signal 67 indicates a "L" with the TCS2 signal 68 at a "H" level, the MASK1 signal is outputted as it is as the MASK0' signal and MASK1' signal.

When the TCS2 signal 68 indicates a "L" level, output from the NAND gate 82 indicates a "H" level regardless of a level of the MASK1 signal. In this state, in a case limited to when the TCS1 signal 67 indicates a "H" level, the MASK0 signal is inverted and outputted from the NAND gate 81. As output from the NAND gate 82 indicates a "H" level, output from the NAND gate 81 is again inverted in the NAND gate 83. Namely, when the test signal 38 indicates a "H" level and at the same time the TCS1 signal 67 indicates a "H" level with the TCS2 signal 68 at a "L" level, the MASK0 signal is outputted as it is as the MASK0' signal and MASK1' signal.

As described above, in operation of the DQM switch circuit 91 according to Embodiment 3, it is possible to select, according to a signal level of the TCS1 signal 67 and TCS2 signal 68, whether the MASK0 signal, namely the DQML signal is used as a mask/disable signal for executing a mask/disable operation for data given to all of the data input/output terminals DQ0 to DQ15, or whether the MASK1 signal namely the DQMU signal is used as a mask/disable signal for executing a mask/disable signal for data given to all of the data input/output terminals DQ0 to DQ15. Thus, it is possible to have the mask/disable operation executed in the testing mode by using only one of the DQMU terminal or DQML terminal as a terminal allocated to a comparator/driver of the IC tester, which in turn makes it possible to reduce a number of comparators/drivers used in the testing.

In description of Embodiment 3 above, it is assumed that, in the write amplifier & sense buffer 57, an operation for disabling data read is executed by a sense buffer, while an operation for masking against data write is executed by a write amplifier, but a configuration is allowable in which an operation for disabling data read is executed by an I/O data buffer and an operation for masking against data write is executed by a write amplifier. Namely, a sense buffer in the write amplifier & sense buffers 57 and the I/O data buffers 47 shown in FIG. 13 may be exchanged with the sense buffer 151*a* and I/O data buffer 131*a* shown in FIG. 23.

Figure 15:
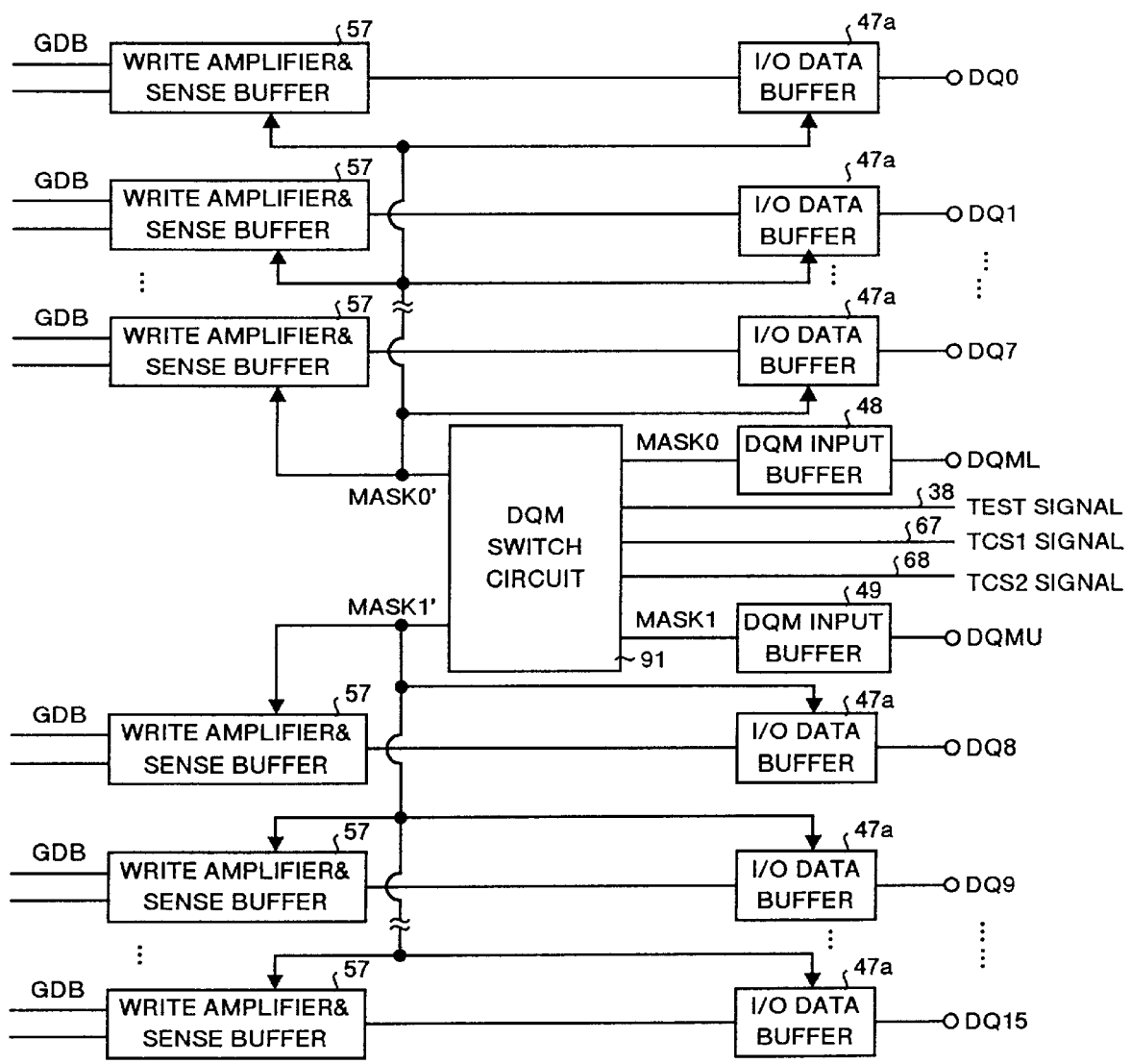
FIG. 15 is a view showing detail configuration of the semiconductor memory according to Embodiment 3 in which an I/O data buffer enabling a disable operation is employed.

FIG. 15 is a view showing detail configuration of the connection among the I/O data buffers 47*a* enabling a disable operation, write amplifier & sense buffers 57 with a mask/disable signal supplied only to the write amplifier thereof, and the DQM switch circuit 91. FIG. 15 is different from FIG. 13 in that the MASK0' signal outputted from the DQM switch circuit 91 is supplied not only to the write amplifier & sense buffer 57 corresponding to the data input/output terminals DQ0 to DQ7, but also to the I/O data buffer 47*a* corresponding to the data input/output terminals DQ0 to DQ7, and that the MASK1' signal outputted from the DQM switch circuit 91 is supplied not only to the write amplifier & sense buffer 57 corresponding to the data input/output terminals DQ8 to DQ15, but also to the I/O data buffer 47*a* corresponding to the data input/output terminals DQ8 to DQ15.

With this configuration, an operation for masking against write data can be executed by the write amplifier & sense buffer 57 (especially the write amplifier), and an operation for disabling read data can be executed by the I/O data buffer 47*a*.

As described above, with the semiconductor memory according to Embodiment 3 comprises, in addition to a plurality of mask/disable terminals for executing a mask/disable operation for data, a test mode decoder for determining a test mode for testing with an IC tester or the like according to a combination of a plurality of input signals each constituting a control instruction such as data write/read and outputting a test signal indicating the testing mode as well as a plurality of test instruction signals, and a DQM switch circuit for selecting and using, when the test signal and the plurality of test instruction signals are active, any of the plurality of mask/disable terminals for enabling a mask/disable operation for all data, so that a number of comparators/drivers used for testing a mask/disable operation with the IC tester can be reduced, and simultaneously a number of semiconductor memories which can simultaneously be tested can be increased. Because of this configuration, with the semiconductor memory according to the present invention, the time and cost required for testing can substantially be reduced.

In addition, the DQM switch circuit comprised a logical gate and a transfer gate, so that the DQM switch circuit can be integrated as a component of a semiconductor memory, and a high speed operation can be realized without requiring expansion of the semiconductor memory.

Description of Embodiments 1 to 3 above assumed a semiconductor memory comprising two mask/disable terminals, but the semiconductor memory may have three or more mask/disable terminals, and in this case it is possible to have the mask/disable operation for input and output of all data with only one mask/disable terminals only by changing a portion of the configuration of the transfer gate and logical gate described above.

Further, description of Embodiments 1 to 3 assumed a SDRAM as a basic component of a semiconductor memory, but such devices as an ordinary DRAM, or SRAM, or EPROM, or EEPROM may be used as a basic component, and any specific type of memory device is not required on the condition that the memory has a plurality of mask/disable terminals.

As described above, with the present invention, allocation of data input/output terminals inhibited for data write/read can be changed by each mask/disable terminal, and even if use of a mask/disable terminal is inhibited, a mask/disable operation of the data input/output terminal allocated for the inhibited mask/disable terminal can be controlled by the other mask/disable terminal, and because the resources for a testing device can efficiently be used, there is provided the advantage that it is possible to obtain a semiconductor memory with improved convenience in use, especially that in testing such as the possibilities of increasing a number of semiconductor memories each having a plurality of mask/disable terminals which can be tested simultaneously and also reducing a time and cost required for testing.

With the present invention, in a second operation mode (testing mode), a mask/disable operation of data input/output terminals belonging to both of the first and second group can be controlled with the first mask/disable terminal, and a number of mask/disable terminals used in the second operation mode can be reduced, and further a number of semiconductor memory devices which can simultaneously be tested with an IC tester can be increased, whereby there is provided the advantage that it is possible to obtain a semiconductor memory with excellent convenience in use especially in testing.

With the present invention, correspondence between data input/output groups and mask/disable terminals based on a operation mode can easily be changed by switching with a changing unit a connection between the first and second master/disable terminals and first and second write/read control circuit sections, whereby there is provided the advantage that it is possible to obtain a semiconductor memory with excellent convenience in use especially in testing.

This application is based on Japanese patent application No. HEI 10-253406 filed in the Japanese Patent Office on Sep. 8, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor memory, capable of executing a mask/disable operation for inhibiting data inputted from or outputted to data input/output terminals, comprising:
    a plurality of groups of said data input/output terminals;
    a plurality of mask/disable terminals receiving mask/disable control signals for controlling said mask/disable operation, each mask/disable terminal corresponding to one of said plurality of groups in a first operation mode; and
    an allocation changing unit for changing a correspondence between said plurality of groups of the data input/output terminals and the mask/disable terminals in a second operation mode.

2. A semiconductor memory, capable of executing a mask/disable operation for inhibiting data inputted from or outputted to a data input/output terminal, comprising:
    first and second data input/output terminal groups;
    first and second mask/disable terminals, each capable to receive a mask/disable control signal for controlling said mask/disable operation;
    a determining unit which determines a first operation mode or a second operation mode; and
    an allocation changing unit, receiving an operation mode signal from the determining unit, which changes the correspondence between the first and second mask/disable terminals and the first and second data input/output terminal groups in such a way that, in the first operating mode, the first and second mask/disable terminals correspond to the first and second data input/output terminal groups respectively, and in the second operation mode, the first mask/disable terminal corresponds to both of the first and second data input/output terminal groups.

3. A semiconductor memory according to claim 2, wherein the second operation mode is a test mode.

4. A semiconductor memory according to claim 2, wherein in the second operation mode, the mask/disable operation of both of said first and second data input/output terminal groups is controlled in response to the mask/disable control signal applied to said first mask/disable terminal.

5. A semiconductor memory according to claim 2, further comprising:
    first and second read/write control circuit sections for writing data on said first and second data input/output terminal groups to a memory array section respectively and also reading out data from the memory array section to the first and second data input/output terminal groups respectively; wherein said allocation changing unit selectively switches connection between the first and second mask/disable terminals and the first and second write/read control circuit sections in response to the operation mode signal from said determining unit.

6. A semiconductor memory according to claim 5, wherein each of the first and second write/read control circuit sections comprises:
    an I/O data buffer circuit receiving the data from corresponding data input/output terminal and outputting data to said corresponding data input/output terminal; and
    a write amplifier/sense buffer circuit which receives and amplifies data from said I/O data buffer circuit and outputs an amplified data to a data bus, and which senses data transferred from said data bus, and transfers the data to said I/O data buffer circuit; wherein said allocation changing unit controls said write amplifier/sense buffer circuit.

7. A semiconductor memory according to claim 6, wherein said allocation changing unit further controls said I/O data buffer circuit.

8. A memory system comprising:
    a plurality of memory devices, each having first and second data terminals, first and second data mask terminals, and a control circuit for controlling data transfer operation from or to the first and second data terminals;
    first and second data buses for transmitting data between the plurality of memory devices and a tester apparatus, the first data bus commonly connected with said first data terminals of the plurality of memory devices and the second data bus commonly connected with said second data terminals of the plurality of memory devices; and
    a plurality of control buses for transmitting a mask signal from the tester apparatus to the plurality of memory devices, each control bus connected with only one of said first and second data mask terminals of a corresponding one of said memory devices;
    wherein said control circuit in each of the memory devices controls data transfer operation from or to both of the first and second data terminals responsive to the data mask signal received at one of the first and second data mask terminals.

* * * * *